US006526546B1

United States Patent
Rolland et al.

(10) Patent No.: US 6,526,546 B1
(45) Date of Patent: Feb. 25, 2003

(54) METHOD FOR LOCATING FAULTY ELEMENTS IN AN INTEGRATED CIRCUIT

(75) Inventors: Guy Rolland, Escalquens (FR); Romain Desplats, Toulouse (FR)

(73) Assignee: Centre National d'Etudes Spatiales, Paris (FR)

( * ) Notice: Subject to any disclaimer, the term of this patent is extended or adjusted under 35 U.S.C. 154(b) by 0 days.

(21) Appl. No.: 09/831,832

(22) PCT Filed: Sep. 14, 2000

(86) PCT No.: PCT/FR00/02554

§ 371 (c)(1),
(2), (4) Date: May 15, 2001

(87) PCT Pub. No.: WO01/20355

PCT Pub. Date: Mar. 22, 2001

(30) Foreign Application Priority Data

Sep. 15, 1999 (FR) .............................. 99 11534

(51) Int. Cl.[7] .............................................. G06F 17/50
(52) U.S. Cl. ............................................. 716/4; 716/5
(58) Field of Search .................... 716/4, 5, 6

(56) References Cited

U.S. PATENT DOCUMENTS 5,602,856 A    2/1997   Teramoto

FOREIGN PATENT DOCUMENTS

EP    0 305 217    3/1989
EP    0 720 097    7/1996

OTHER PUBLICATIONS

Stamenković et al., May, 2000. International Conference On Microeletronics. pp. 735–738.*

* cited by examiner

Primary Examiner—Tom Thomas
Assistant Examiner—Douglas W. Owens
(74) Attorney, Agent, or Firm—Young & Thompson

(57) ABSTRACT

A process for locating defective elements in an integrated circuit. The integrated circuit is modelled in the form of a tree formed of nodes and oriented arcs. Measurements are performed at various nodes of the circuit by applying a sequence of tests at the input of the circuit. The nodes to be tested are determined recursively as a function of the result of the tests previously performed. Each new test node is such that the number of its ancestors is substantially equal to the number of its descendants.

9 Claims, 23 Drawing Sheets

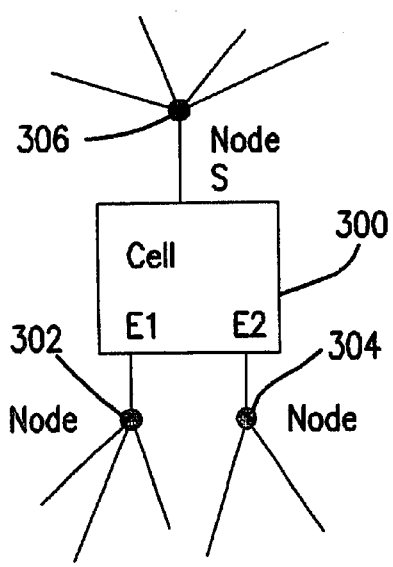
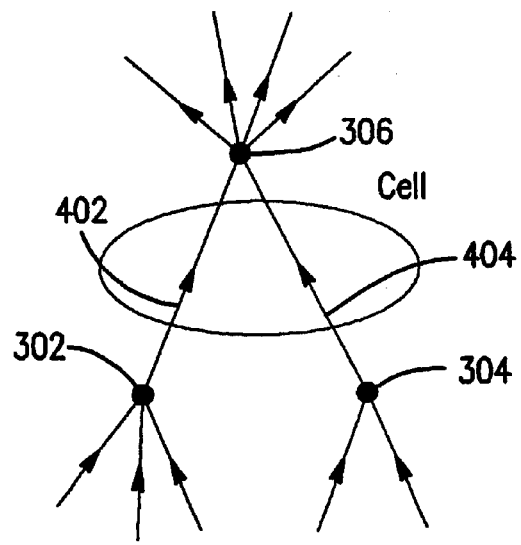
FIG. 3
FIG. 4
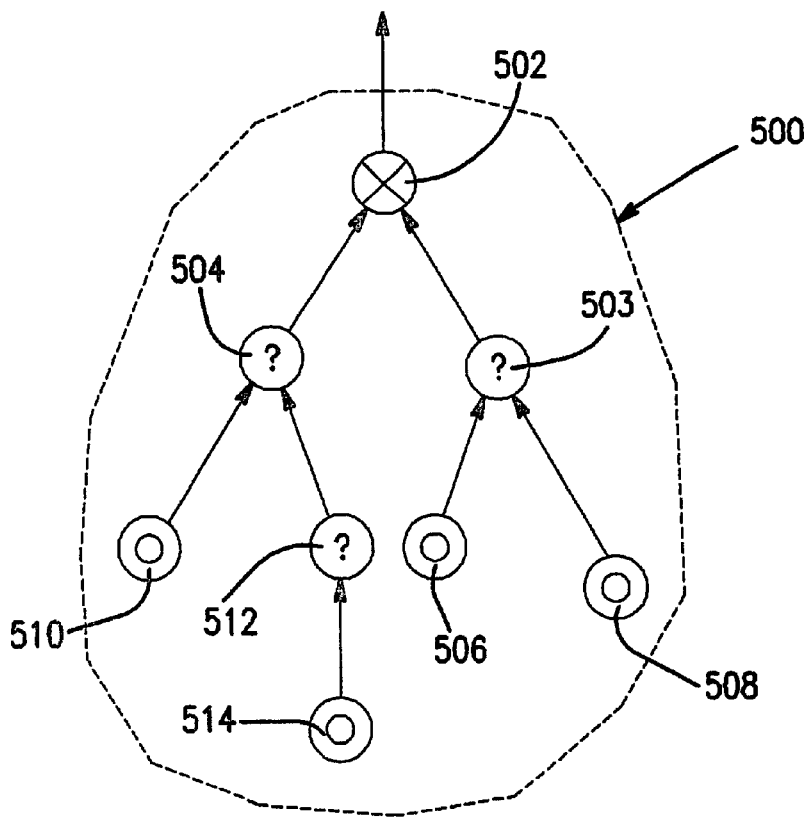
FIG. 5

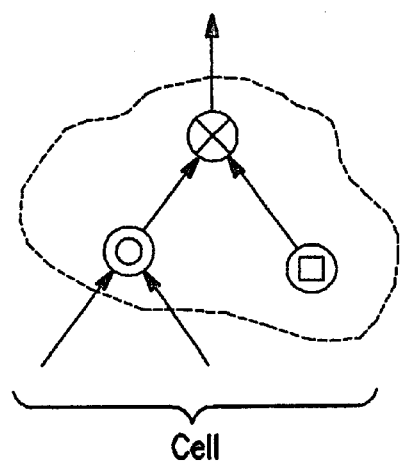
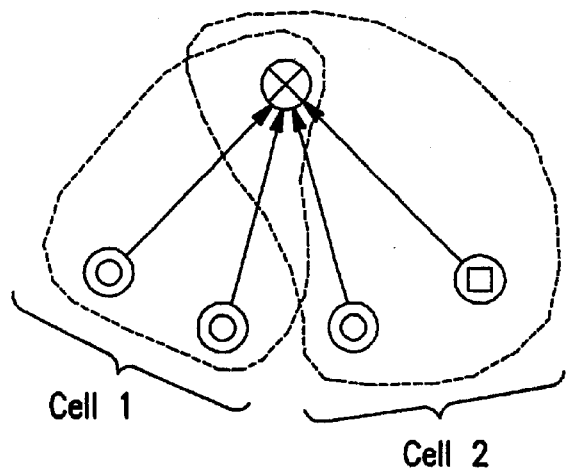
FIG. 6        FIG. 7
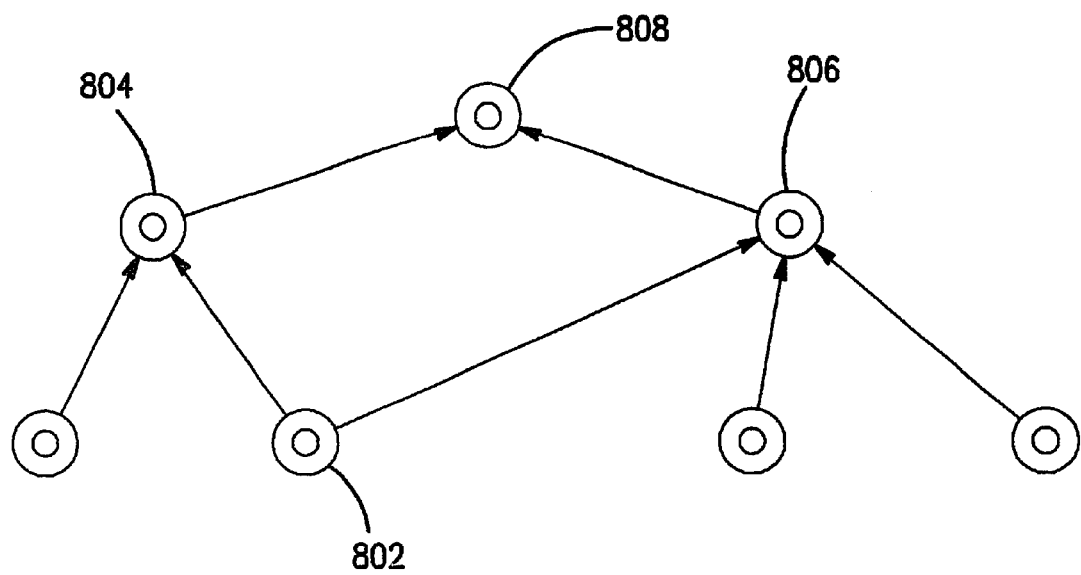
FIG. 8A

METHOD FOR LOCATING FAULTY ELEMENTS IN AN INTEGRATED CIRCUIT

The present invention relates to a process for locating a defective element in an integrated circuit whose theoretical layout is known, of the type comprising a succession of steps consisting in:

the determination of a measurement point of the integrated circuit; and the testing of the measurement point determined by implementing:

the application of a sequence of tests to the inputs of the integrated circuit;

the measurement of signals at the determined measurement point of the integrated circuit, during the application of the sequence of tests; and the assessment of the measurement point by comparison of the measured signals with theoretical signals which ought to be obtained at the determined measurement point so as to assess whether the measurement point is faulty or satisfactory; and in which the position of the defective element of the integrated circuit is determined from assessments performed at the various determined measurement points.

It is expedient, in the manufacture of integrated circuits, or when searching for faults in industrial systems, to be able to determine the origin of defects or breakdowns.

In particular, in the case of defective integrated circuits, it is necessary to be able to determine which component or components constituting the integrated circuit exhibit an operating anomaly.

The number of components involved in the construction of an integrated circuit is generally very high so that it is very tricky to locate the one or the few defective elements from among the multitude of elements from which the breakdown may result.

A process for analysing integrated circuits, known by the English term "backtracking", is currently known. To implement this process, a testing rig is used, making it possible with the aid of hardware or virtual probes to plot signals flowing at various circuit measurement points.

By knowing the theoretical structure of the integrated circuit analysed, the signals which ought to be measured at the various circuit measurement points are determined as a function of a sequence of tests applied to the inputs of the circuit.

In order to locate the defective elements in the circuit, a defective output of the circuit is first considered and then we backtrack from this output to the inputs, gradually testing each of the successive measurement points. As long as the measurements performed at the various points reveal signals which are incorrect as compared with the theoretical signals which ought to be obtained, one deduces that the defective elements of the circuit are upstream of the measurement point. As soon as correct signals are obtained at a measurement point, one deduces that the defective element is situated between the measurement point where correct signals are obtained and the previous measurement point where incorrect measurement signals were obtained.

Each measurement actually performed on the integrated circuit requires a considerable time which may range from a few seconds if the measurement point is at the surface to 5 to 10 minutes if the measurement point is situated on a deep layer of the integrated circuit and if a prior hardware port must be made with the aid, for example, of a focused ion beam.

It is appreciated that, with the method currently used, it is sometimes necessary to traverse back through the nub of the integrated circuit if the defective element is very close to an input of the circuit. Owing to the complexity of the circuits and their numerous constituent branches, the search for the defective element may prove to be extremely lengthy.

The aim of the invention is to propose a process for detecting errors in a circuit allowing faster locating of defective zones, whilst preserving great reliability in this locating.

Accordingly, the subject of the invention is a process of the aforesaid type, characterized in that it comprises initially:

a step of modelling the theoretical layout of the integrated circuit, in the form of at least one graph comprising a set of nodes and of arcs oriented from the inputs of the circuit to the outputs of the circuit;

considering as a search subgraph, a subgraph whose vertex-forming node corresponds to a faulty measurement point;

and in that, for the search for the defective element, it comprises the steps of:

assigning each node of the search subgraph considered a characteristic variable dependent on the structure of the search subgraph;

considering as measurement point the measurement point corresponding to a node of the subgraph considered, obtained by applying a predetermined criterion pertaining to the characteristic variables of the set of nodes of the search subgraph considered;

performing a test of the measurement point considered;

considering as new search subgraph:

either the search subgraph previously considered, while excluding the node corresponding to the measurement point tested and all its parent nodes, if the measurement point is satisfactory or a subgraph whose node corresponding to the measurement point is the vertex, if the measurement point is faulty; and searching for the defective element in the new search subgraph considered, until a predetermined stopping criterion is satisfied.

According to particular modes of implementation, the process comprises one or more of the following characteristics:

during the initial step of modelling the theoretical layout of the integrated circuit, the circuit is modelled the form of a tree by possible creation of virtual nodes when one and the same node is the parent of at least two nodes, themselves parents of one and the same node;

it comprises, after satisfaction of the predetermined stopping criterion, the steps of:

evaluating in the or each last search subgraph whether, for each virtual node corresponding to a faulty measurement point, the twin node associated with the said virtual node is a node of the same subgraph also corresponding to a faulty measurement point; and then considering the or each subgroup for which the condition is satisfied as corresponding to a part of the integrated circuit comprising at least one defective element;

the said characteristic variable peculiar to each node is the number of ancestors of this node in the search subgraph considered;

the said predetermined criterion is suitable for determining the node whose number of ancestors is substantially equal to the mean number of ancestors per node in the search subtree considered;

it comprises a step of assigning each node a compliance indicator initially fixed at a faulty state; and for the determination of the new search subgraph to be considered, it comprises the steps of:

fixing the compliance indicator of the node corresponding to the measurement point tested and of all its parent nodes at a satisfactory state, if the measurement point tested is satisfactory; and considering as new search subgraph the subgraph included within the previous search subgraph and comprising only those nodes whose compliance indicator is fixed at the faulty state; and the search subgraph initially considered is formed at the intersection of the subgraphs each having as vertex a node corresponding to a faulty output of the integrated circuit.

The subject of the invention is also a device for locating a defective element in an integrated circuit whose theoretical layout is known, of the type comprising means for performing a succession of steps consisting in:

the determination of a measurement point of the integrated circuit; and the testing of the measurement point determined by implementing:

the application of a sequence of tests to the inputs of the integrated circuit;

the measurement of signals at the determined measurement point of the integrated circuit, during the application of the sequence of tests; and the assessment of the measurement point by comparison of the measured signals with theoretical signals which ought to be obtained at the determined measurement point so as to assess whether the measurement point is faulty or satisfactory; and means for determining the position of the defective element of the integrated circuit from assessments performed at the various determined measurement points, characterized in that it comprises:

means for initial modelling of the theoretical layout of the integrated circuit, in the form of at least one graph comprising a set of nodes and of arcs oriented from the inputs of the circuit to the outputs of the circuit;

means for initially considering as a search subgraph a subgraph whose vertex-forming node corresponds to a faulty measurement point;

and in that, for searching for the defective element, it comprises means for:

assigning each node of the search subgraph considered a characteristic variable dependent on the structure of the search subgraph;

considering as measurement point the measurement point corresponding to a node of the subgraph considered, obtained by applying a predetermined criterion pertaining to the characteristic variables of the set of nodes of the search subgraph considered;

performing a test of the measurement point considered;

considering as new search subgraph:

either the search subgraph previously considered, while excluding the node corresponding to the measurement point tested and all its parent nodes, if the measurement point is satisfactory or a subgraph whose node corresponding to the measurement point is the vertex, if the measurement point is faulty; and searching for the defective element in the new search subgraph considered, until a predetermined stopping criterion is satisfied.

The invention will be better understood on reading the description which follows, given merely by way of example and with reference to the drawings in which:

FIGS. 3 and 4 are diagrammatic views respectively of an elementary circuit and of its representation in the form of an inter-node influence graph;

FIG. 5 is a view of an example of a faulty zone of a modelling of an integrated circuit;

FIGS. 6 and 7 are views respectively of a faulty cell on its own and of two faulty cells sharing the same output;

FIGS. 8A and 8B are diagrammatic views respectively of a graph comprising a cycle and of a tree resulting from a modification of the graph by applying the cut principle;

Figure 1:
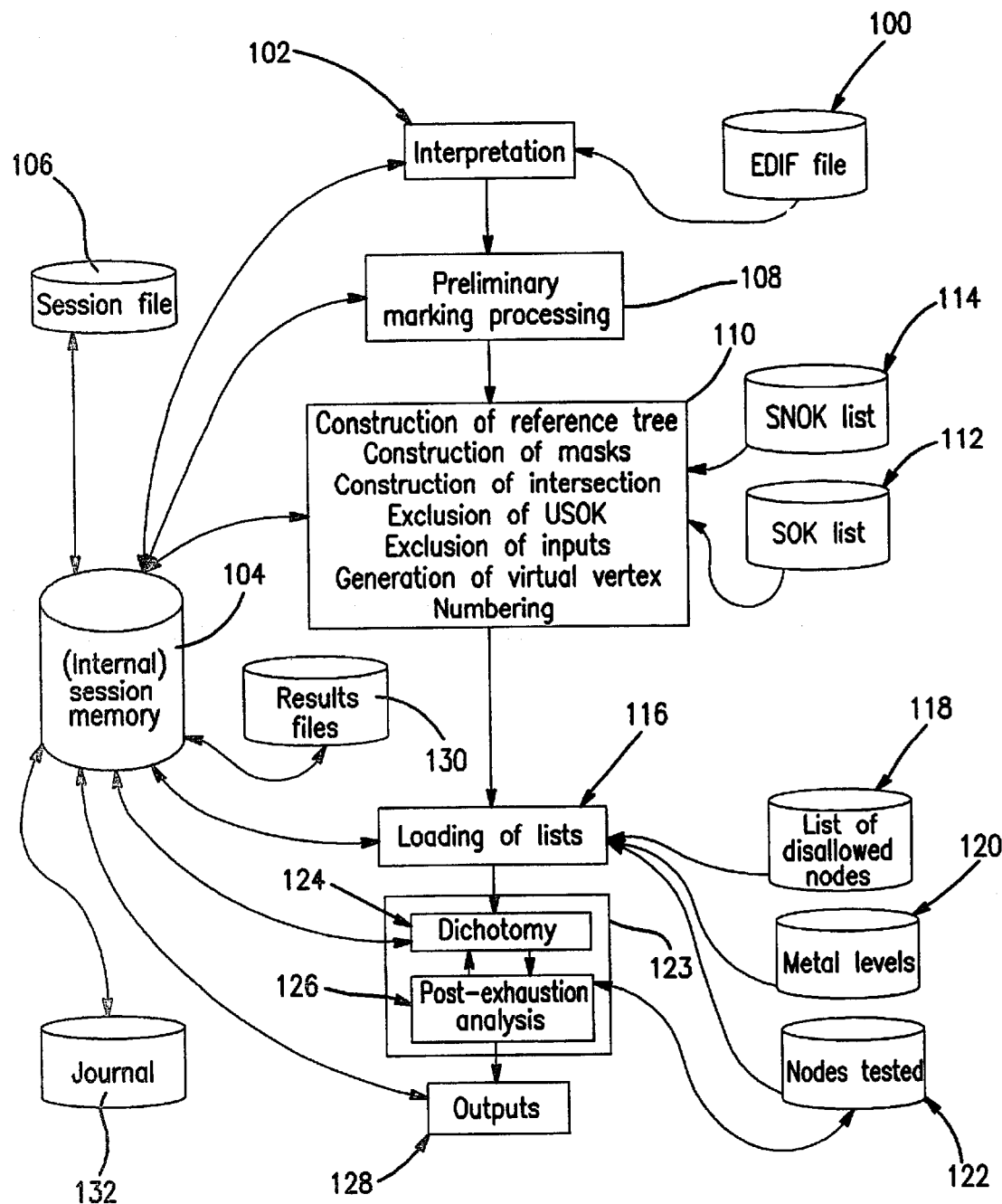
FIG. 1 is a diagrammatic view of a general schematic giving the interdependence of the data and of the actions during the implementation of a process according to the invention.

Represented in FIG. 1 is the schematic diagram of the data and of the actions implemented by a rig for checking an integrated circuit implementing the process according to the invention.

The program implemented by this rig makes it possible to determine progressively, on the basis of the theoretical diagram of an integrated circuit, the points where physical measurements ought to be made by implementing a sequence of appropriate tests.

After each acquisition of the result of the test performed previously, making it possible to determine whether the signal received at the measurement point is or is not correct, the process implemented determines a new point where a test ought to be performed on the basis of a new sequence of tests.

In tandem with the acquiring of the results of the automatically proposed tests, the process according to the invention makes it possible to locate that region of the integrated circuit in which the defective element is situated and ultimately to locate the latter rapidly.

The test sequences implemented for each of the measurement points of the integrated circuit are of any suitable type and are for example comparable to those implemented in a "backtracking" process. Since the test sequences are known per se, they will not be described in the subsequent description.

Likewise, the means used to measure a signal at a determined measurement point of the integrated circuit, during the application of a sequence of tests will not be described in detail, they being of any suitable type.

The process according to the invention can be implemented with a rig comprising, on the one hand, test means such as a scanning electron microscope making it possible to plot signals flowing at determined measurement points of the integrated circuit during the application of a sequence of tests, and, on the other hand, an information processing unit, such as a microcomputer implementing a suitable program determining, in accordance with the process of the invention, the points of the circuit where successive measurements ought to be performed, and deducing from the measurement results the position of the defective elements in the circuit.

Illustrated in FIG. 1 are the various data files used as well as the processing operations performed on them, so as to determine, on the one hand, the successive points where measurements should be performed on the circuit and, on the other hand, the defective elements or zones of the circuit.

The general structure of the program implements the session concept.

A session can be defined as a set of consistent files relating to given conditions for the inputs and the parameters of the program. A session also contains the set of intermediate files generated by the program, and which are necessary for operations and for storing the number of the last calculation step performed.

The content of a session is defined in a text file whose name bears the extension ".ses". The root of the name is defined freely by the user.

The loading by the program of a preexisting session file restores the calculation context specific to this session (same data files, same check parameters and intermediate results) and enables the calculations to be restarted at the point where they were interrupted.

The sequencing of the various operations is performed by a function main( ).

The code for this function is found in a file "principal.c".

According to the principle of the program, the various operations are chained together sequentially.

Five main phases may be distinguished and will be detailed in what follows:

The EDIF interpretation phase

The marking phase

The numbering phase (this phase encompasses the construction of the reference tree, the construction of the minimal subset and the creation of the virtual vertex)

The fault location phase

The reporting phase.

The calculations can be interrupted on completion of each of these phases. In this case, all the intermediate results required for the subsequent resumption of the calculations are automatically archived in save files. These files have names comprising a ".data" extension. The degree of progress of the calculations is also archived.

The calculations are resumed in a transparent manner, that is to say without having to make reference to these intermediate files, by simply loading the appropriate session file.

Initially, the theoretical structure of the circuit, that is to say the structure of a defect-free circuit, is stored in a file 100, which is for example in the EDIF format.

This file is firstly processed during an interpretation phase 102 enabling the file describing the theoretical circuit to be put into the form of an internal format specific to the implementation of the process. The manner of interpretation 102 and the format specific to the application of the process will be described in the subsequent description.

Generally, interpretation consists in modelling the theoretical circuit in the form of a graph, whose nodes correspond to the inputs and to the outputs of the various components of the integrated circuit and in which the components are represented by sets of oriented arcs interlinking the nodes.

The interpretation algorithm receives and addresses data to an internal session memory 104 catering in particular for temporary storage of the file containing the graph of the circuit presented according to a utilizable format.

This memory 104 is linked to a session file 106 catering for storage of the session data on a permanent medium such as a hard disk.

On completion of the interpretation 102, the session file is subjected to a marking phase 108 associated with other preliminary processing operations.

The next phase denoted 110 is the so-called "minimal subset construction and numbering phase". Its aim is in particular to define subsets from among the various trees modelling the circuit. In particular, during phase 110, two series of information are taken into account, namely the list, denoted 112, of outputs of the circuit operating correctly, and the list, denoted 114, of outputs of the circuit not operating correctly. Accordingly, the outputs of the circuit are tested on the basis of sequences of tests, as will be explained in the subsequent description.

On the basis of the session file obtained at the output of step 110, a phase 116 of loading the lists is implemented. This phase takes into account the list of disallowed nodes stored in a file 118, the list of levels of metal 120 specifying the metal layers on which the various elements of the circuit are present, as well as a file 122 containing the list of nodes already tested.

The subsequent phase 123 consists in locating the defective components or groups of components causing faults in the operation of the circuit. According to the invention, this search for faults is performed according to a dichotomy process effected with regard to certain particular trees of the circuit, by taking account of a waiting also referred to as the numbering of each of the nodes, performed according to a predetermined method.

During the dichotomy phase denoted 124, an additional analysis phase 126, the so-called "post-exhaustion analysis phase" is also implemented, this making it possible to supplement the dichotomy-based search for faults. This additional phase makes it possible to take account of the circuit modelling constraints which have led to certain conventional modifications of the graph representing the circuit.

Finally, the results are made available to the user during the final phase 128.

As represented in the schematic diagram, each of the processing phases 102, 108, 110, 116, 124, 126, 128 receives and addresses data from and to the internal session memory 104. The latter is moreover linked to a set of results files 130, as well as to a storage journal 132. The latter respectively ensure that the results of the analysis are made available to the user and ensure the archiving of the comments printed on the screen.

Figure 2A:
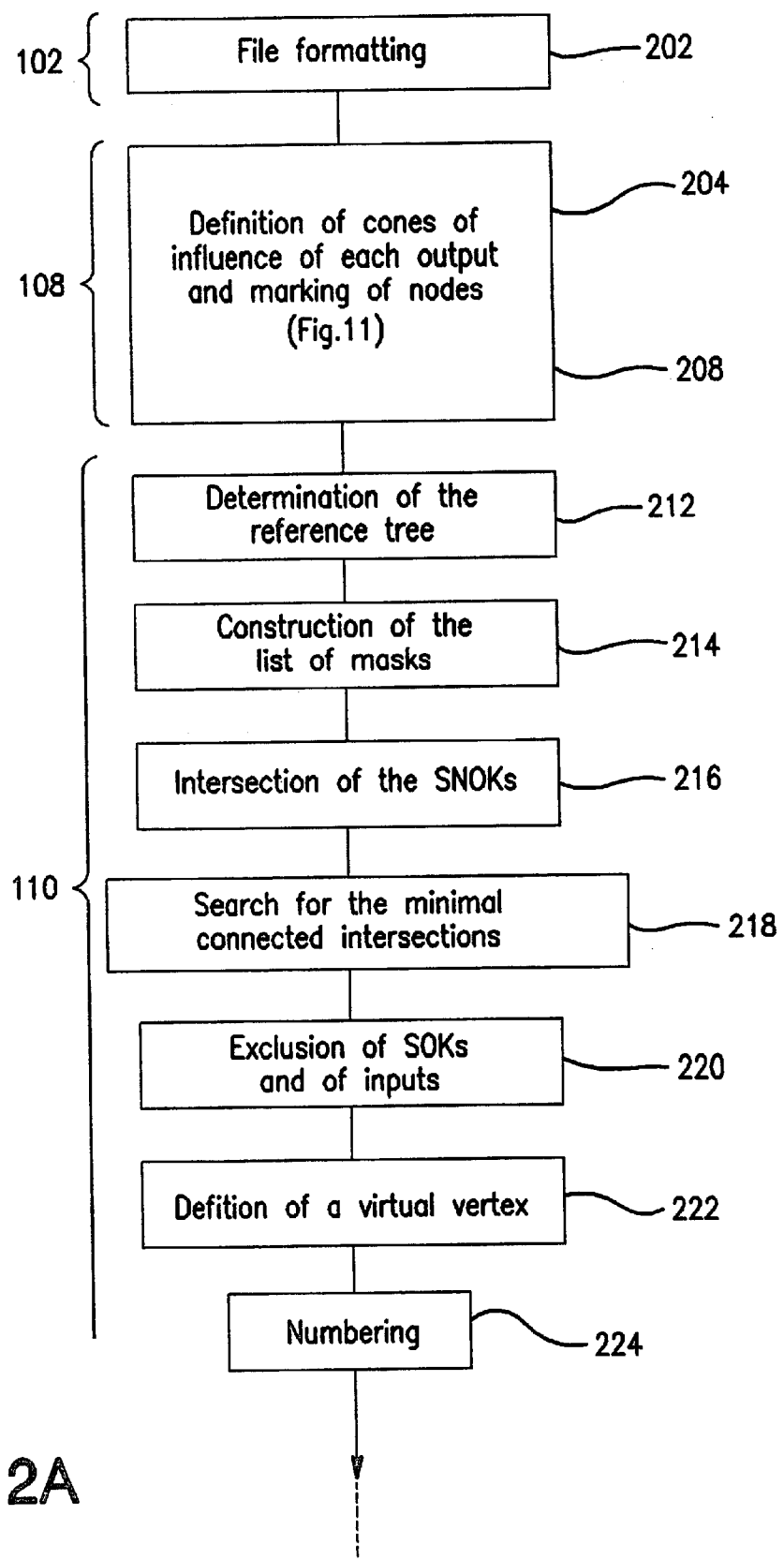
FIG. 2 is a more detailed view of the flow chart implemented in the rig whose schematic is given in FIG. 1.
Figure 2B:
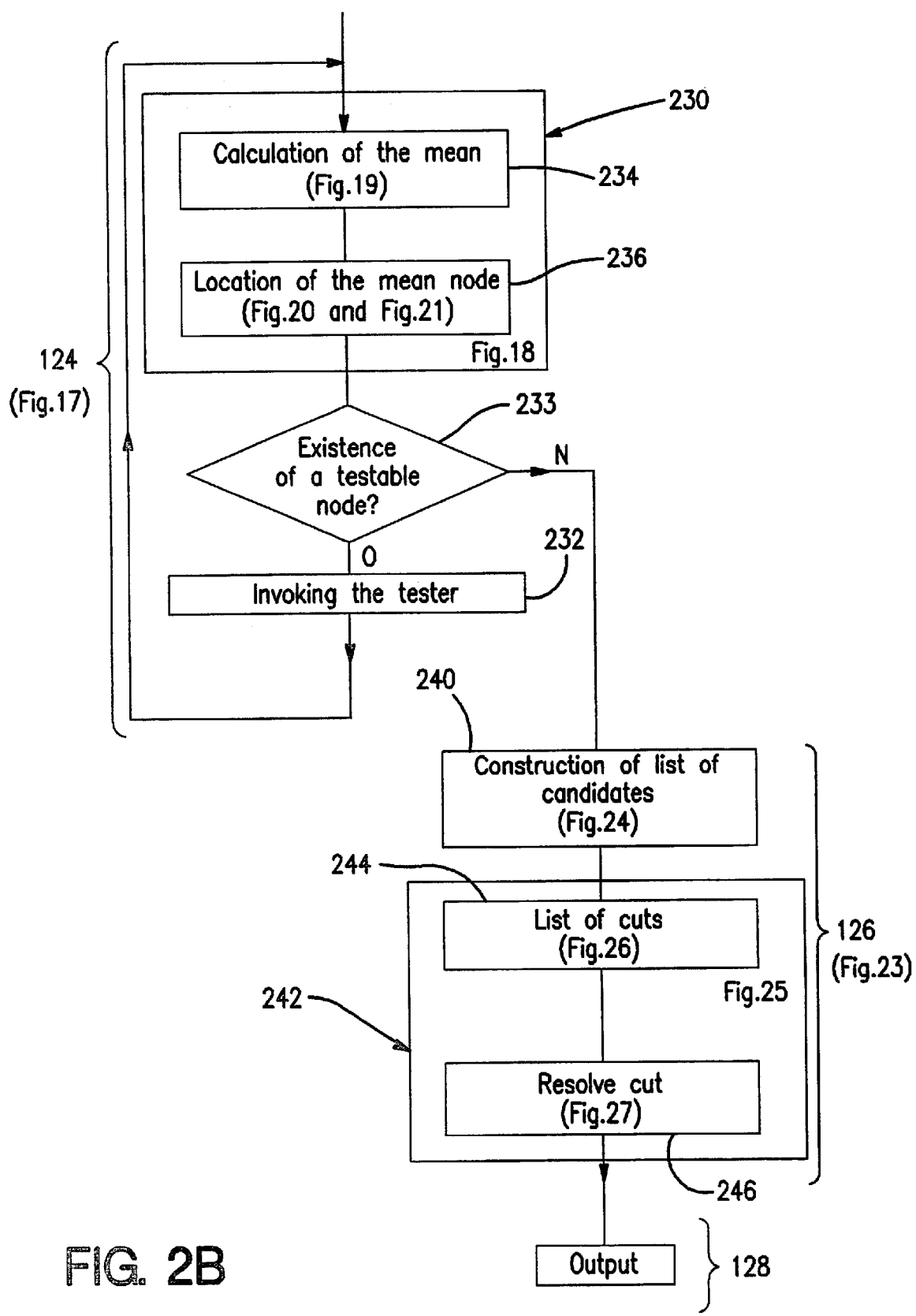

Each of the successive phases 102, 108, 110, 124 and 126 for implementing the process according to the invention is described in greater detail in FIG. 2.

Thus, the detailed description of the full algorithm will be performed with regard to FIG. 2, where each of the elementary steps will be described in succession with reference to other yet more detailed illustrative figures.

The first step of the initial phase 102 for formatting the file describing the integrated circuit is designated by the reference 202 in FIG. 2.

In general, a circuit can always be described as a set of cells comprising inputs and outputs connected by nodes. The choice of the hierarchical definition of a cell is arbitrary. It may for example be a functional subset constituting a macrocell, or be a gate or a transistor. Likewise, the concept of inputs and outputs of the circuit to be analysed can be immediately carried over to the inputs and outputs of an internal block, the analysis then pertaining to this block.

With the type of description used, the signals are observed only on the nodes.

The description of the cells reduces to the influence which their input nodes exert on their output nodes. The initial circuit description formed of a set of cells and of nodes, can therefore be transformed into an inter-node influence graph by replacing each cell, an example of which is given in FIG. 3, by a set of oriented arcs such as illustrated in FIG. 4.

Represented in FIG. 3 is a cell 300 consisting for example of an AND gate. This cell comprises two inputs E1 and E2 linked to input nodes 302 and 304 respectively. These input nodes are linked to the outputs of other cells (not represented) of the integrated circuit. The output, denoted S, of the cell 300 is linked to a node 306 to which are linked the inputs of other cells (not represented) of the integrated circuit.

In FIG. 4, the cell 300 is replaced by two oriented arcs 402 and 404 respectively linking the input nodes 302 and 304 to the output nodes 306 of the cell.

Thus, the cell 300 is modelled simply by the two oriented arcs 402 and 404.

By virtue of such modelling of all the cells, the full description of the circuit thus takes the form of a graph.

In such a modelling of the circuit and as illustrated in FIG. 5, a faulty zone 500 is a subgraph and even, after applying modifications which will be explained later, a subgraph.

Several types of nodes appear in this figure.

The bad nodes are designated by a nought at the centre of which there is a cross. The bad nodes are the nodes for which, for a given test sequence applied to the input of the circuit, a signal is obtained which differs from the theoretical signal which ought to be obtained for this measurement point.

Certain nodes are untestable nodes. These are for example nodes situated on deep layers of the integrated circuit and to which access is impossible or difficult. These nodes are designated by a nought inside which there is a question mark.

The good nodes, as opposed to the bad nodes, are nodes where for a given sequence of tests, the measured signal corresponds to the theoretical signal which ought to be obtained. These good nodes are designated by a nought inside which there is another nought.

In the example of FIG. 5, the faulty zone 500 consists of a subtree whose vertex 502 is a bad node. This bad node 502 is controlled by two untestable nodes 503 and 504. The first untestable node 503 is linked to two good nodes 506 and 508. The second untestable node 504 is linked to a good node 510 and to an untestable node 512 itself linked to a good node 514.

In general, a subtree constituting a faulty zone has the following properties:

The vertex is a node on which the signal is bad.
All the terminations are nodes on which the signal is good
Untestable nodes may exist between the vertex and the terminations. In the converse case, one is dealing with a faulty cell or with faulty cells whose outputs are connected to the same node.

An example of a faulty cell on its own is represented in FIG. 6. An example of two faulty cells sharing the same output is described in FIG. 7. In these figures, the conventions of FIG. 5 are used.

In practice, the interpretation step 202 consists in transforming the initial file describing the circuit, in the Edif format, for example, into a file of a determined format specific to the implementation of the process (file whose name bears the suffix ".parsed").

According to the nature (tagged by one of the suffixes ".edn", ".edf" or ".edo") of the initial file, the program runs the appropriate interpreter.

These interpretation programs are used as commands for the operating system through the function "system( )" of the C language.

In the case where the initial description does not comply with the formats of the available interpreters, it is always possible to make direct use of a description in the internal format (".parsed" format).

The format of these internal files is given in Table 1.

The conventional constraints to be adhered to are as follows:

It is a text file.
No line may be skipped.
The various blocks must be placed in the following order: the blocks describing the outputs; the blocks describing the inputs; the blocks describing the internal cells and the blocks describing the nodes.
The numbering of the outputs commences at zero and terminates at N.
The numbering of the inputs commences at N+1 and terminates at (number_of_pins−1)
The numbering of the internal cells (instances) commences at (number_of_pins) and terminates at (number_of_pins+number_of_cells internal−1).
The nodes are numbered from zero to (number_of_ nodes−1).
The numbering of the nodes in the blocks relating to the outputs, to the inputs and to the instanced cells must be consistent with the numbering of the blocks describing the nodes.

The numbers for the cells in the blocks describing the nodes must be consistent with the numbering of the instanced cells, the numbering of the inputs, as well as the numbering of the outputs which is performed upstream in the file.

TABLE 1

| Structure of a file in the internal description format (".parsed.") | | |
| --- | --- | --- |
| Number_of_pins | Number_of_cells_internal | Number_of_nodes |
| Name_Cell_Output  Number_Cell_Output  1  Name_Pin_input  Number_of_node_input  0 | | To be repeated for each output pin |
| Name_Cell_Input  Number_Cell_Input  1  0  Name_Pin_output  Number_of_node_of_output | | To be repeated for each input pin |
| Name_Cell  Number_Cell  Number_inputs | | |
| Name_Pin_input  Number_of_node_input | For each cell input | To be repeated for each input pin |
| Number_outputs | | |
| Name_Pin_output  Number_of_node_of_output | For each cell output | |
| Name_of_node  Number_of_node  Number_of_pins_connected_to_this_node | | |
| Name_pin  Number_cell_to_which_the_pin_belongs | For each pin (cell or input/output) | For each node |

Three fundamental lists are constructed from this file. These are:
A chained list of structures of NODE type to describe the nodes;
A chained list of structures of CELL type to describe the pinout;
A chained list of structures of CELL type to describe the instanced cells;
All the other data structures constructed subsequently contain, in general, pointers to the elements of theses lists so that duplication of the information is avoided as far as possible.

The first step 204 of the marking and preliminary processing phase 108 consists in finding, for each output of the integrated circuit, the set of nodes which might influence it. These sets of nodes are called "cones of influence". A marking of the nodes, as will be described subsequently in the description, is performed simultaneously.

On completion of this step 204, it is possible to enumerate, for each node of the circuit, the set of outputs of the circuit which the node might influence. It is on the basis of the cones of influence, assigned to each node, that the various intersection and exclusion operations presented subsequently in the description are performed.

At the start of step 204 for constructing the cones of influence, a certain number of preliminary calculations relating to the outputs are performed. This involves:
Counting the number of outputs;
Counting the number of groups of markers;
Filling in the common arrays associated with the outputs. These common arrays are:
The array giving the group number of each ouput: groupOutput[ ];
The array giving the rank of each output: rankoutput [ ];
The array giving the numerical value of the marker for each output: markeroutput[ ];
The array containing the addresses of the structures relating to each output: addressOutput[ ];
The array of names of the outputs nameOutput[ ];
The array containing the total number of nodes in the cone relating to each output: totalOutput[ ].

The usefulness of these various arrays is apparent after reading the following paragraphs relating to the method of marking the nodes.

To construct the code of influence of an output, we start from this output and we traverse the influence graph with a standard algorithm for traversing trees, such as a "prefixed order" algorithm.

Since the influence graph is not a tree, according to the nature of the initial circuit, this graph can comprise cycles due to the presence of sequential or combinatorial loops in the circuit.

When engaged in such a cycle, one returns at a given moment to an already analysed node. The algorithm is suitable for detecting the return to a node. When this event occurs, the algorithm creates a fictitious termination, dubbed a "cut", and goes back the way it came.

According to the principle of cuts, the latter are performed when returning to already analysed nodes. The concept of cut is illustrated in FIGS. 8A and 8B.

Represented in FIG. 8A is an influence graph which does not exhibit the form of a tree since one of the nodes, denoted 802, is the parent of two nodes 804 and 806, the latter being themselves the parents of one and the same node 808. Thus, the nodes 802, 804, 808 and 806 form a combinatorial loop.

Figure 8B:
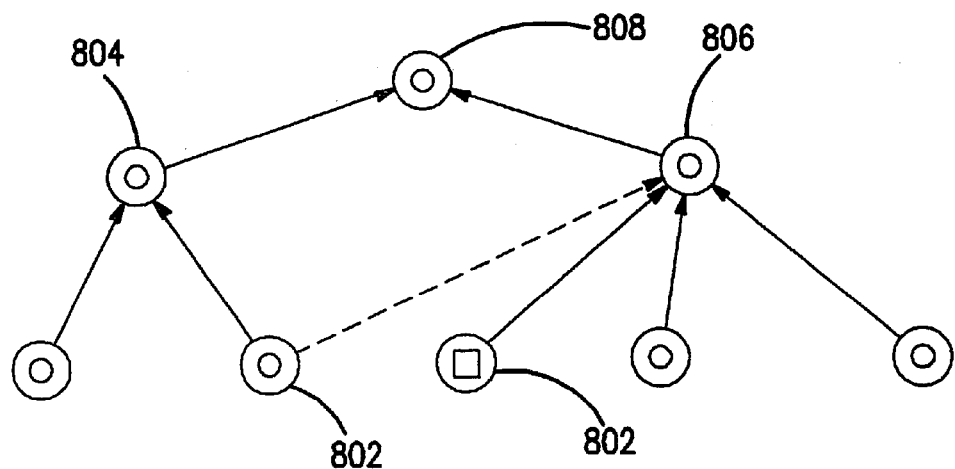

In order to create a tree from the graph of FIG. 8A, and as illustrated in FIG. 8B, a virtual node 810, constituting a cut, is added as parent of the node 806. In the subsequent drawings, the cuts are represented by a nought enclosing a square.

The node 802 is retained as parent of the node 804. Thus, the node 810 constitutes a virtual twin node of the node 802. The oriented arc emanating from the node 802 and pointing to the node 806 is deleted from the data structure. It is indicated as a reminder by dashes in FIG. 8B.

In the data structure, a "parent" field of the structure describing the node 810 points to the twin node 802 in the list of nodes. By operating in this manner a tree is obtained, since all the cycles are open.

The cones of influence are therefore subgraphs of the influence graph which are furnished with appropriate cuts.

They have a tree structure, the vertex of which is an output and the terminations of which are either inputs or cuts.

A marking of the nodes is performed simultaneously with the defining of the cones of influence.

The aim of the marking is to record for each node the outputs of the component which it influences.

This recording is achieved by acting on a "marker" associated with each node.

Each time a new node is found along the journey, the number of the output whose cone of influence is constructed is allocated to the variable "marker", which is assigned to the node.

These markers are arrays of integers whose type (TYPEMASK) is a type predefined in the header "structure.h". The "marker" field in each "NODE" structure is a pointer to the first element of this array.

Each of the bits of these integers is used to register whether an output can or cannot be influenced by this node. If the bit corresponding to the output of index n is set to 1, the node influences the output n. Otherwise this bit is left at zero.

Since the integers are limited in their number of bits, the set of outputs must be split into groups and an integer must be assigned to each group so as to register the outputs of the group. The number of codable outputs is thus unlimited.

Initially, the program counts the output pins.

Let "numberOfOutputs" be the number of output pins.

The numbers of bits per integer is given by an instruction in the C language:

NUMBEROFBITS=sizeof(TYPEMASK)*8.

The number of groups is therefore given by:

numberOfGroups=IntegerPart((numberOfOutputs−1)/NUMBEROFBITS)+1

This number of groups serves to dimension the marking arrays.

The group of output n is determined by:

groupOutput[$n$]=IntegerPart($n$/NUMBEROFBITS).

The rank of output n is also defined by:

rankoutput[$n$]=$n$ Modulo(NUMBEROFBITS).

A given output is therefore tagged by a (group, rank) pair.

In order to set the bit corresponding to output number n to 1, we add "2 to the power rankOutput[n]" to the integer of the array corresponding to the group of output n.

For each output, the corresponding value of this increment of the marker is calculated in the preliminary calculations. These values are registered in the common array "markerOutput[ ]".

If "node" is the pointer containing the address of the node to be processed, the activation of its marker for output "n" is therefore achieved with the following C instruction:

node→marker[groupOutput[$n$]]+=markerOutput[$n$];

In order for this mechanism to operate, each node which may be for output n must be so marked once only. Before marking a node for output n, we must therefore test for whether or not this node has already been marked for this output. To do this, the following is carried out:

The "node" address of the node and the number n of the output being given, the group corresponding to this output is determined by reading the array groupoutput[ ].

This group number is used to locate the element corresponding to this output in the marker array associated with this node.

The logic AND is applied between this element of the array and the value contained in the common array markerOutput[ ]for this output number, i.e.:

test=(node→marker groupOutput[$n$]])&(markerOutput[$n$]);

The test value is different from zero if the bit corresponding to output n is already at the value 1 in the marker associated with the node.

The allocating of the correct values to the markers associated with each node is performed by executing the marking algorithm whose principle is set out below.

This algorithm guarantees that any node is marked just once for all the outputs which it is capable of influencing.

This algorithm is suitable for the case of vector markers, as set out above. It is also suitable for constructing the reference tree, as will be set out hereinbelow.

The principle of the algorithm is to traverse the cone of influence of the circuit from each output with a standard algorithm for traversing trees, such as a "prefixed" order algorithm. Each time a node can be marked, we verify whether or not it has already been marked. If it has already been marked, the algorithm considers that is has reached a termination and it goes back the way it came.

During the marking, the total number of nodes contained in each cone of influence is also counted. These totals are stored in the common array "totalOuput[ ]".

The "zero" value of the "mode" parameter indicates to the algorithm that it must perform the marking of the nodes. The "one" value of the "mode" parameter indicates to the algorithm that it must perform the construction of the reference tree. The construction of the reference tree will be explained in the subsequent description.

Figure 9:
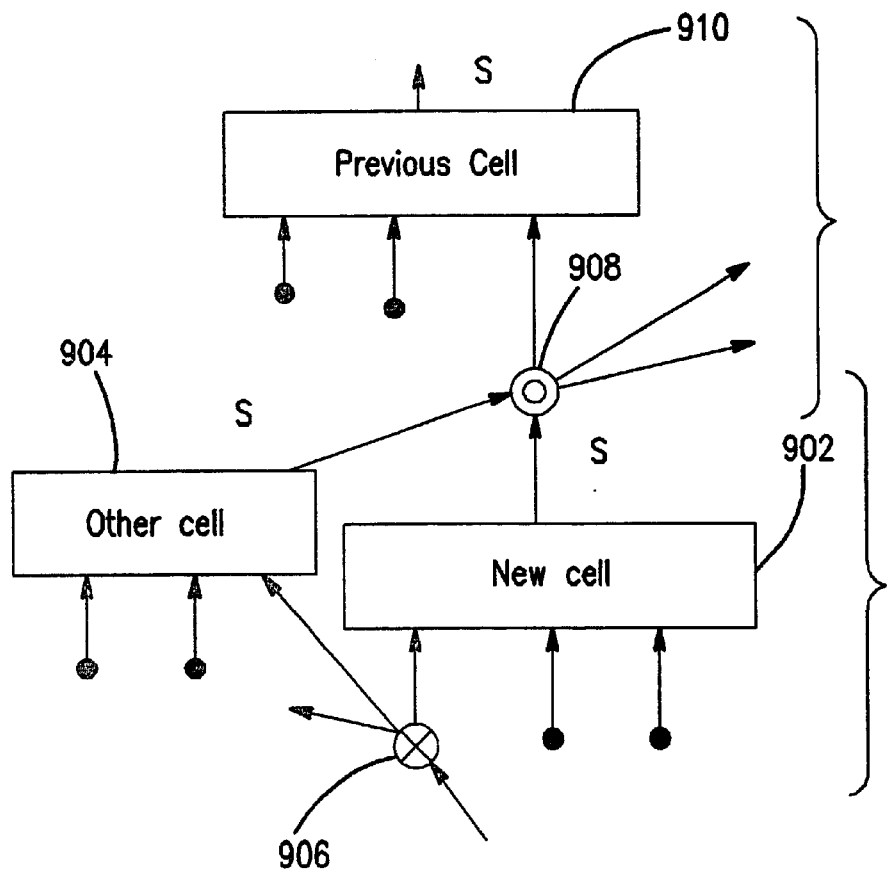
FIG. 9 is a diagrammatic view of cells of the tree illustrating the principle of the traversing of a tree for the marking thereof.

The graph is traversed by recursively calling two functions illustrated diagrammatically in FIG. 9.

Figure 10:
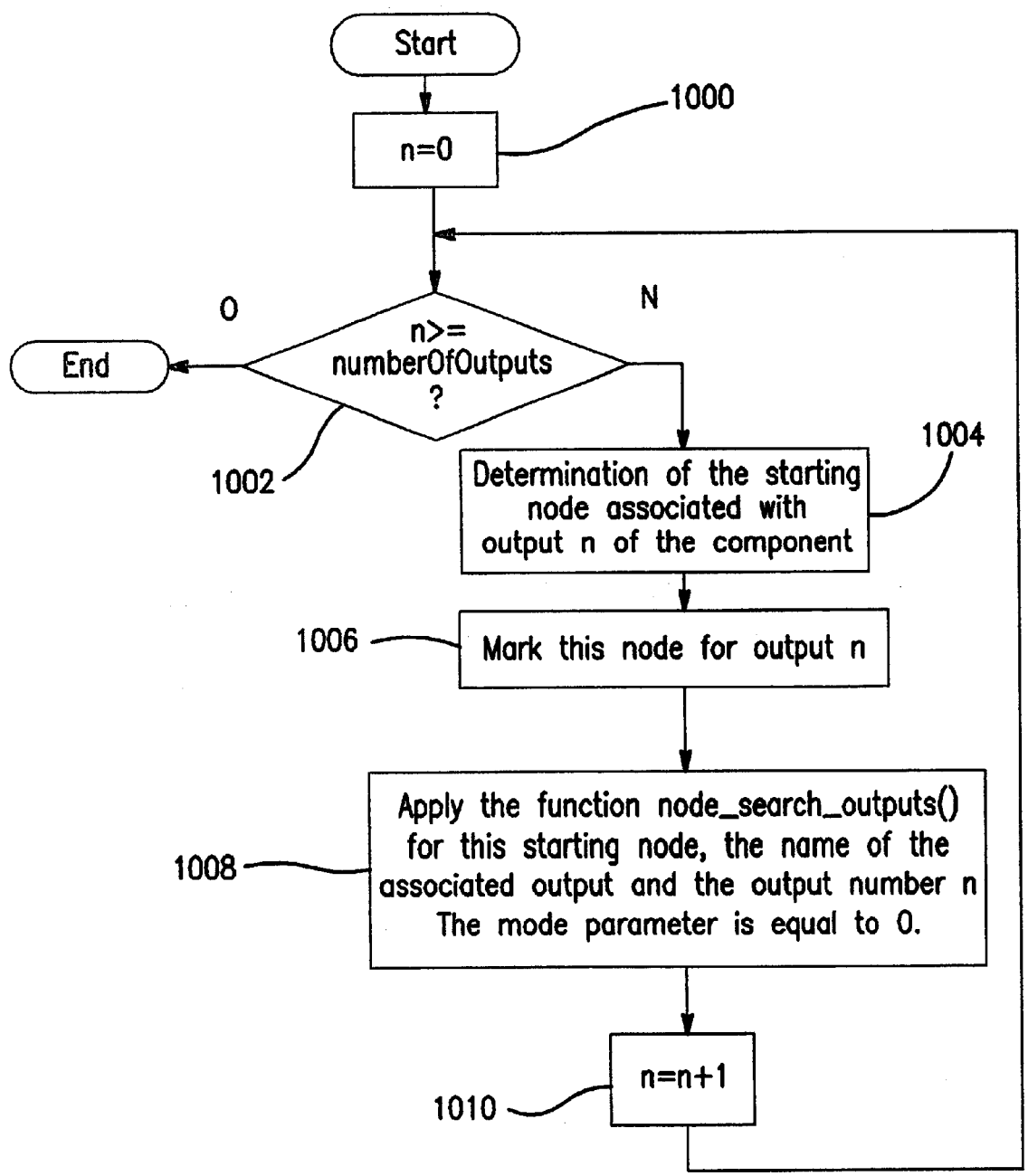
FIG. 10 is a flow chart explaining the general sequencing of the marking by the function marking( )

The chaining together of the various steps of the marking algorithm which is the subject of the function marking( ) is set out in FIG. 10. These various steps call upon the functions set out hereinbelow which will be described with regard to FIGS. 11 and 12.

The function node_search_outputs( ) (FIG. 11): this function is executed while analysing the environment of a node. It searches for the various outputs of cells connected to a given node and for each of these outputs calls the function output_search_nodes( ).

The function output_search_nodes( ) (FIG. 12): this function is executed while analysing the inputs of the cell whose output has been selected by the function node_search_outputs( ). For each of the input pins of this cell, it marks, if need be, the node where it is connected and issues a call to the function node_search_outputs( ) from this new node.

Represented in FIG. 9 are two cells 902 and 904 whose output is linked to one and the same node 908 linked to an input of another cell 910. Likewise, two inputs of the cells 902 and 904 are linked to one and the same node 906.

By initializing the process on node 908, the application of the function node_search_outputs( ) makes it possible to identify one of the outputs of the cells 902 and 904. The subsequent application of the function output_search_nodes( ) makes it possible to find the node 906 to which are connected inputs of the cells 902 and 904.

It is appreciated that the recursive application of the two functions makes it possible to traverse the entire graph.

Specified in FIG. 10 is the flow chart of the marking function. In this figure, the variable n is used to traverse the outputs of the integrated circuit to be tested. Initially, at step 1000, the variable n is fixed at 0.

As long as there are still outputs of the integrated circuit to be traversed, the marking procedure is implemented. Accordingly, a test is performed in step 1002 to compare the variable n with the total number of outputs of the integrated circuit.

In step 1004, the node of the modelling of the integrated circuit associated with the output n considered is determined.

In step 1006, this node is marked for the output n.

In step 1008, the function node_search_outputs( ) is applied for the node considered. Thus, by successively applying the recursive functions node_search_outputs( ) and output_search_nodes( ), the entire tree associated with the output is traversed by applying the algorithms described with regard to FIGS. 11 and 12.

After the tree associated with output n is exhausted, the variable n is incremented in step 1010. The test performed in test 1002 is then reimplemented. The marking function is concluded after all the outputs of the integrated circuit have been processed.

Figure 11:
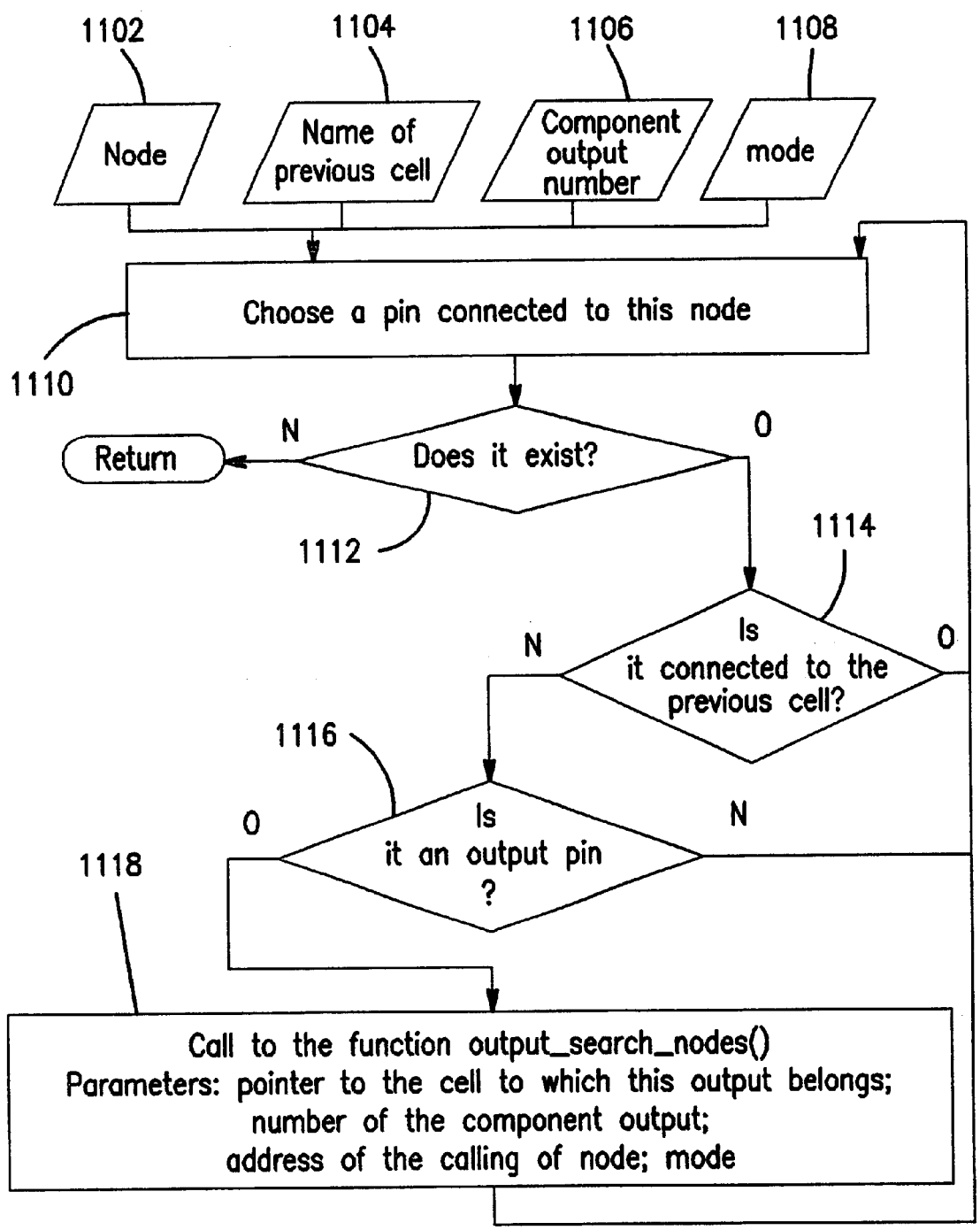
FIG. 11 is a flow chart explaining the function node_search_outputs( ) used during the marking.

The function node_search_outputs( ) whose flow chart is presented in FIG. 11, receives as input the node 1102 from which it computes, the name of the previous cell 1104, the number of the output of the integrated circuit 1106 whose tree is currently being marked as well as the operating mode of the function 1108. For the marking, and as indicated earlier, the mode is fixed at 0.

In the initial step 1110, a pin connected to the node provided at 1102 is chosen. Step 1112 verifies that this pin exists. If such is the case, step 1114 verifies that the pin is connected to the previous cell. If such is the case, step 1110 is reimplemented. If the response to the test performed in step 1114 is negative, step 1116 verifies that the pin considered is an output pin. If such is not the case, another pin is chosen in step 1110.

If the pin considered is an output pin, step 1118 is implemented. The latter consists in calling the function output_search_nodes( ) associated with the corresponding parameters.

On completion of the function output_search_nodes( ), a new pin is chosen in step 1110.

Figure 12:
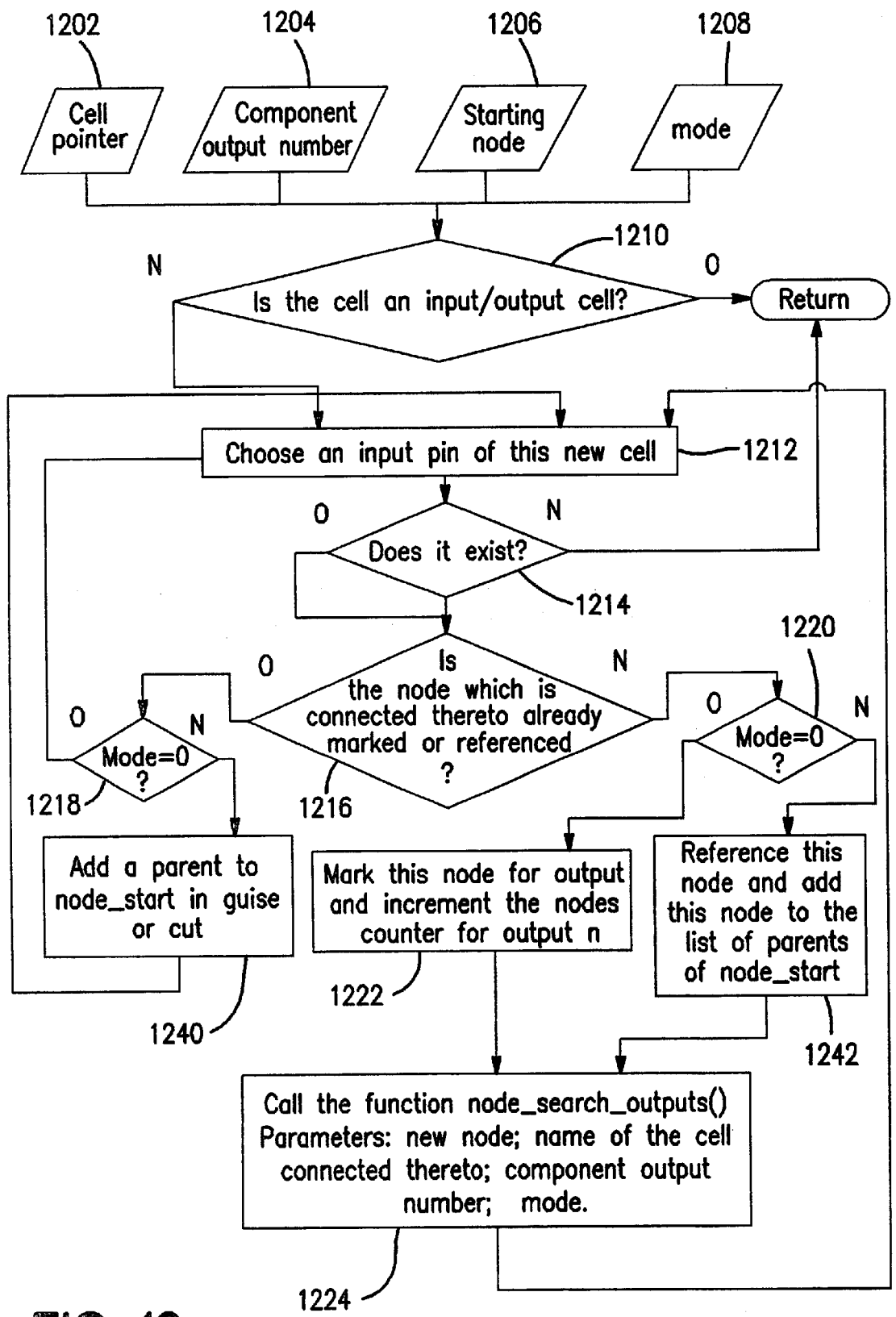
FIG. 12 is a flow chart explaining the function output_search_nodes( ) using during the marking.

When called from step 1118 and as illustrated in FIG. 12, the function output_search_nodes( ) employs as input variable the pointer of the cell considered 1202, the number of the output considered of the integrated circuit 1204, the starting node 1206, and also the mode 1208. The latter is fixed at 0 for the marking.

Step 1210 firstly verifies that the cell is an input or output cell. If such is the case, the algorithm goes back the way it came. If such is not the case, step 1212 is implemented during which an input pin of the new cell is chosen.

Step 1214 verifies that this input pin exists. If it actually exists, step 1216 verifies that the node which is connected is already marked. If the latter is already marked, and if the mode is at 0 during the test performed in step 1218, a new input pin is chosen by a new implementation of step 1212.

If the node considered is not already marked, and if the mode is at 0 during a verification of step 1220, this node is marked for output n considered in step 1222 and the counter of nodes of output n is incremented. Finally, in step 1224, the choice of a new input pin is performed by calling the function node_search_outputs( ).

The reciprocal recursive calls of the functions outputs_search_nodes( ) and node_search_outputs( ) allow complete traversal of the trees associated with each of the outputs, the set of outputs being scanned by applying the marking algorithm of FIG. 10.

Thus concludes the marking phase 108. On completion of the latter, the minimal subset construction and numbering phase 110 commences.

For the construction of the minimal subset, the state of operation of the outputs of the circuit to be analysed must be known.

Accordingly, a sequence of appropriate tests is previously applied to the inputs of the circuit to be analysed, so as to determine from among the outputs of the circuits those on which a satisfactory or correct signal appears and those on which a faulty or incorrect signal appears.

Thus, the outputs of the circuit are distributed into two groups. The first group of satisfactory outputs is defined in a list dubbed SOK (acronym standing for Output OK).

The circuit outputs considered to be faulty are grouped together into a second list dubbed SNOK (acronym standing for Output Not OK).

These lists are designated by references 112 and 114 in the flow chart of FIG. 1.

To summarize, at this juncture, the input data of the program are:

The file describing the circuit in the form of a set cells and of interconnection nodes. If this file is in one of the Edif formats (extensions ".edf, .edn or .edo"), the program automatically runs an interpreter (parser). The circuit can also be described using the internal description format (extension ".parsed"). The latter format makes it possible to access an arbitrary hierarchical level of definition of the cells without involving the constraints of the Edif.

The list of outputs found to be faulty at a given moment of the test sequence (SNOK).

A list (optional) of outputs which have never been found to be faulty during the execution of the test sequence (SOK).

In step 212, the algorithm determines the reference tree, that is to say the tree in which the circuit faults will be searched for.

Among the cones relating to the SNOK outputs, there exists at least one which contains the smallest number of nodes. This particular cone is the reference cone. This is the cone in which the faults will be searched for. This is set forth in the paragraphs which follow.

The program selects, for the reference output, the faulty output whose cone of influence contains the smallest number of nodes. These numbers of nodes are contained in the common array totalOutputs[ ].

Once the reference output is known, the function node_search_outputs( ) is executed with the value 1 for the "mode" parameter.

The mechanism for constructing the reference tree is similar to that for marking.

However:

Instead of using arrays of markers, a "reference" scalar field of each NODE structure is used to register a node's membership of the reference tree.

Each node of the reference tree is assigned a list of parents. The "list_parents" field in each NODE structure is a pointer to the start of the parents list associated with this node. An element of the parents list contains a pointer to the parent node. A pointer to the cell linking the node to this parent and a label indicating whether or not this parent is a cut.

The parents list elements are described in the header file "structures.h".

The specific steps in the construction of the reference tree appear emboldened in FIG. 12.

In particular, when constructing the reference tree, the test performed in step 1216 determines whether the node connected to the chosen pin has or has not been reference. If such is the case, after step 1218 which verifies that the mode is equal to 1, step 1240 is implemented. It consists in adding a parent to the starting node in the guise of a cut. On completion of this step, a new input pin is chosen in step 1212.

If during the test performed in step 1216 it is found that the node which is connected to the input pin 15 has not already been referenced, and that the mode is equal to 1 during the test performed in step 1220, step 1242 is implemented. During this step, the node considered is referenced and this node is added to the list of parents of the starting node.

On completion of this step, the call to the function node_search_outputs( ) is performed again in step 1224.

The vertex of the reference tree is the input node of the output cell associated with the reference output.

The decomposition of the influence graph into into trees is not unique. It depends, in particular, on the order of recording of the parents in the list of parents. However, this does not seem to give rise to any particular problem with regard to method.

The following steps, denoted 214 to 220, of the minimal subset construction phase 110 consist in constructing the smallest subset of nodes containing breakdowns and in which the search proper for faults will be performed. This subset is dubbed the "minimal subset".

The minimal subset is a subgraph of the reference tree. Its method of construction is given hereinbelow.

When one or more faults simultaneously affect a group of outputs, their position has to be searched in the subset formed by the intersection of the cones of influence of these outputs.

This subset is denoted: $\bigcap_i SNOKi$ where SNOKi is the cone of influence of the output of index i from the list SNOK.

A subset consisting of the union of the cones of influence of nonfaulty outputs corresponds to a set of nodes which are not points of propagation of faults.

A subset of this type is denoted: $\bigcup_j SOKj$ where SOKj is the cone of influence of the output of index j of the list SOK.

A subset $\bigcup_j Sokj$ has, in general, a nonempty intersection with the subset $\bigcap_i SNOKi$.

The search can therefore be reduced by eliminating this intersection from $\bigcap_i SNOKi$.

We then obtain the "minimal subset" denoted SM in which all the searches for faults will be performed.

From the formal point of view, we have:

$$SM = \bigcap_i SNOKi - (\bigcap_i SNOKi \cap \bigcup_j SOKj)$$

Figure 13:
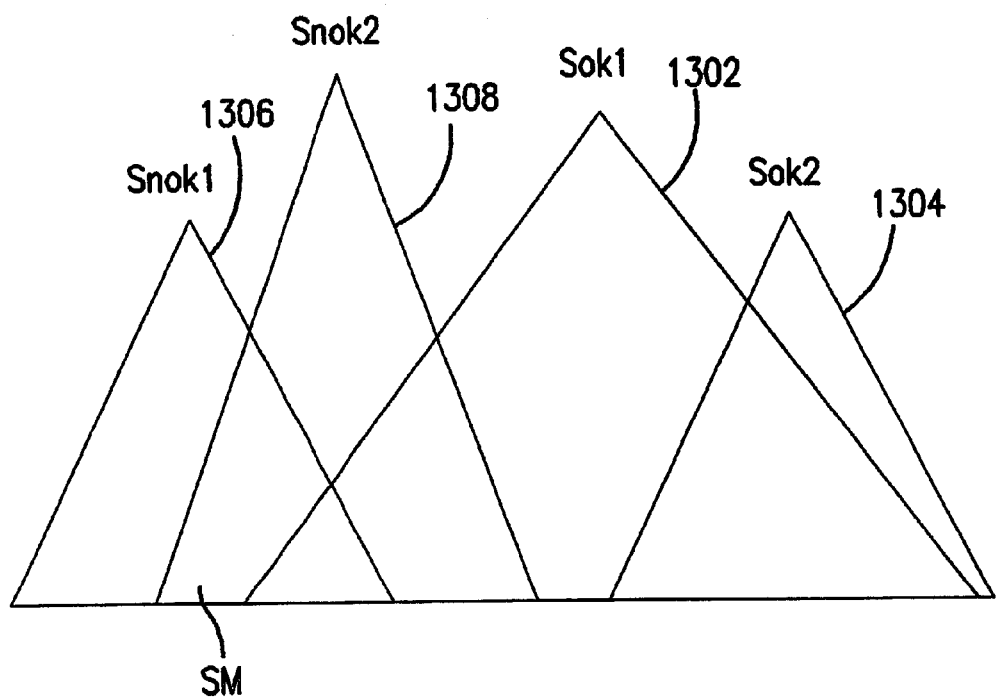
FIG. 13 is a diagrammatic view of the construction of a minimal subset.

The subset SM is illustrated in FIG. 13 by considering two cones denoted 1302 and 1304 corresponding to correct outputs SNOK1 and SNOK2 and two cones denoted 1306 and 1308 corresponding to incorrect outputs SNOK1 and SNOK2.

The minimal subset SM found has the structure of a set of disjoint trees. The vertices of these trees are joined to a virtual node in such a way that the search algorithms applied subsequently need only manipulate a single tree.

For a given list of faulty outputs, the intersection $\bigcap_i SNOKi$ is constructed by searching for the set of nodes which simultaneously influence all the outputs of the list.

It may therefore happen that the intersection of the faulty outputs leads to an empty subset.

Figure 14:
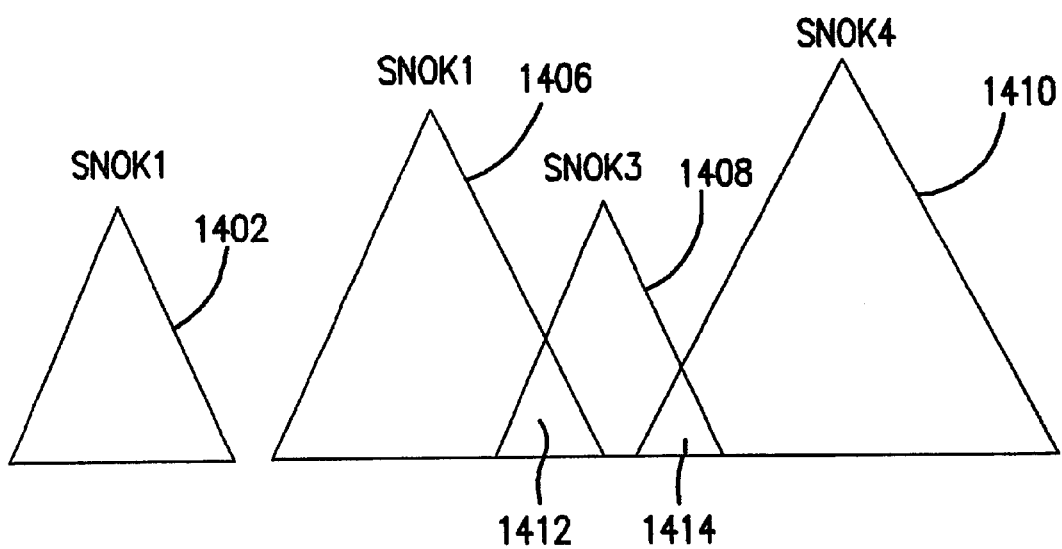
FIG. 14 is a diagrammatic view of nonconnected intersections between subgraphs of the reference tree.

Such is the case if the faulty outputs have disjoint cones or else if the intersection is not connected as illustrated in FIG. 14. In this case, there are several independent faulty zones.

In the particular case of FIG. 14, the cones 1402, 1406, 1408 and 1410 are each associated with a faulty output of the integrated circuit. The cone 1402 is disjoint from the cones 1406 to 1410, these latter three cones exhibiting intersections.

It is noted, through the hatched zones in FIG. 14, that the intersection of the cones 1406 to 1410 forms two disjoint sets denoted 1412 and 1414 whereas the cone 1402 itself constitutes a faulty zone whose extent cannot be reduced since this cone does not possess any intersection with the other cones associated with faulty outputs.

The program is suitable for detecting these particular cases and slices up the list of faulty outputs in such a way that for each slice of the list the intersection found by the program is connected and minimal.

To explore these zones correctly, the operator must reexecute the program on each of the proposed slices of the list.

In a connected subset, the program is suitable for processing multiple faults, unless these faults interact and mutually correct one another, for example.

In order to construct the minimal subset, step 214 firstly constructs lists of masks.

The lists of outputs SNOK and SOK are used to construct two lists of masks, the addresses of whose first elements are contained in the pointers: mask_NOK and mask_OK.

An element of these lists is a structure whose type (MASK) is predefined in the "structures.h" header. The "mask" field of these structures is an integer of the predefined type (TYPEMASK).

It serves to code the outputs cited in the list of outputs and relating to one and the same group. This group is registered in the same structure through the "group" field which is an ordinary integer (int).

The principle of the coding of the outputs in a mask is identical to that adopted for the markers. The number of elements of a list of masks is therefore the number of groups required to tag the outputs cited in the associated list of outputs. The correspondence between the output number and the group is already registered in the array groupoutput[ ] cited previously.

The "masks" fields of these lists of masks are intended to be compared with the content of the markers of the same group of each of the nodes so as to carry out the intersection and exclusion operations.

In order for the marking mechanism to operate, there must be no multiple reference to one and the same output in the list of outputs.

When constructing the mask_NOK list, no account should be taken of the output chosen as reference since the intersection will be searched for in this output's cone.

The various intersection and exclusion operations required to construct the minimal subset are carried out by comparing the markers of the nodes of the reference tree with the masks constructed from the lists SNOK and SOK.

Step 216 then carries out the intersection of the lists of the SNOKs.

To decide whether a node is included in the intersection of the lists of SNOKs, the value of the mask and the marker relating to the same group associated with this node are compared for each element of the list "maskSnok".

If the node is a member of the intersection, all the bits equal to one in the masks must be equal to one in the corresponding markers for all the groups of the list "maskSnok".

The comparison is made using the logic AND.

This consists, for each element of the list of masks, in testing the veracity of the following condition: value_marker(group) & value_mask==value_mask.

Figure 15:
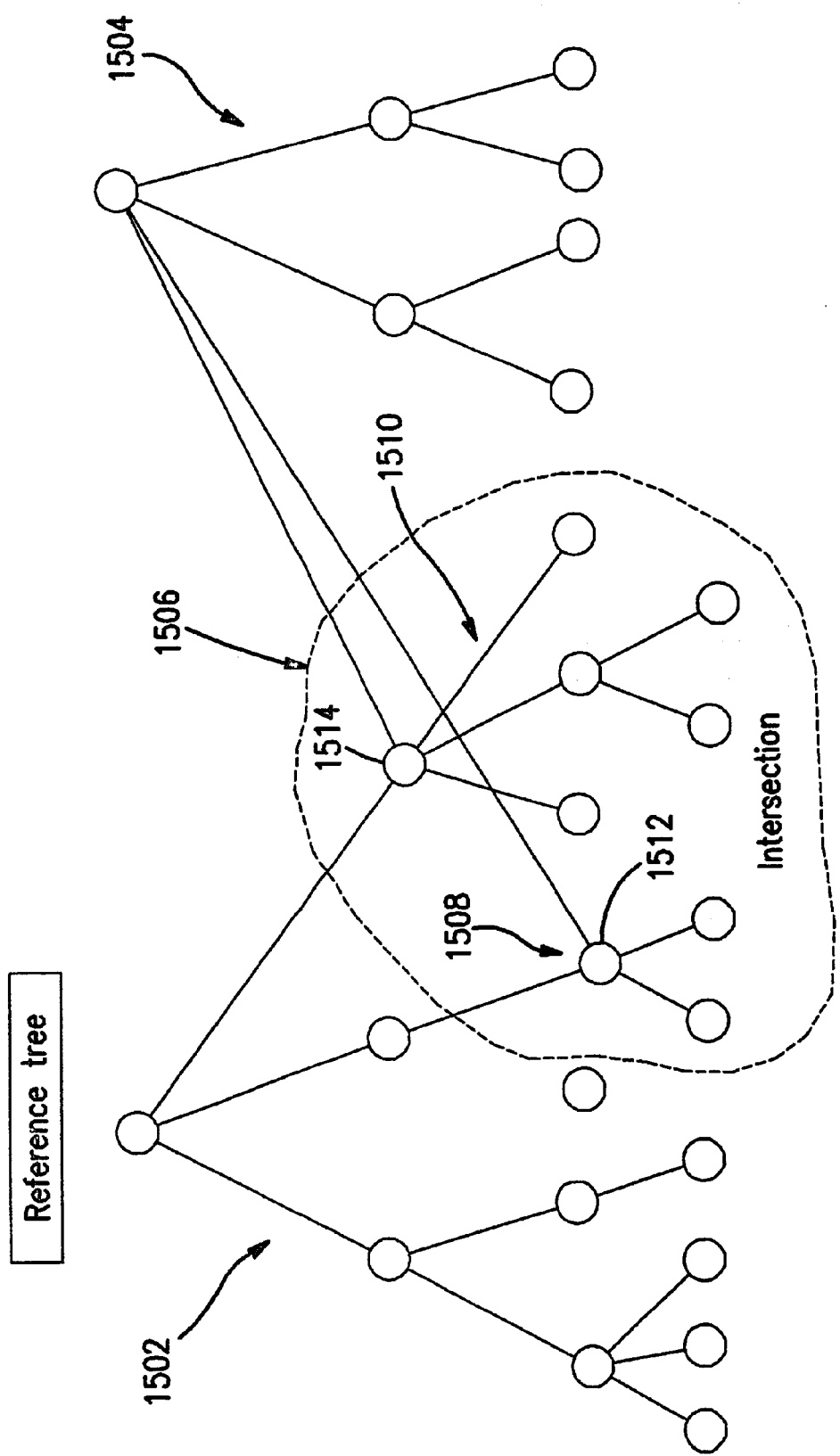
FIG. 15 is a diagrammatic view giving an example of an intersection of two trees.

Represented in FIG. 15 is, on the one hand, the reference tree denoted 1502 and, on the other hand, another tree 1504, both associated with an incorrect output.

The intersection, denoted 1506, of the two trees is surrounded by a dashed line. In this figure it may be noted that the structure of the intersection is that of a set of subtrees 1508 and 1510, whose vertices 1512 and 1514 are respectively linked by an oriented arc to at least one node of each of the trees 1502 and 1504.

The structure of the intersection is that of a set of disjoint subtrees of the reference tree. If these trees were not disjoint, at least one cycle would exist in the reference tree, this being impossible by construction.

To define the intersection 1506 it is therefore sufficient to be able to enumerate the vertices 1512 and 1514 of these trees.

To find the vertices of these trees, the reference tree is traversed from its vertex with a standard procedure. As soon as a node is found which is a member of the intersection, it is a vertex; it is recorded in a list and the algorithm goes back the way it came as if this were a termination.

The cuts also interrupt the descent but are not taken into account in the guise of vertex. If need be, their twin may be taken as vertex when it is analysed.

The method set forth in the previous paragraph consists in searching for the set of nodes which simultaneously influence all the outputs of the list of SNOKs.

It may therefore happen that the intersection found is empty. This is the case if the faulty outputs have disjoint cones or else if the intersection is nonconnected as in the case of FIG. 14.

When the intersection found is empty, the program searches in step 218 for the connected minimal intersections.

These subsets are the intersections of cones which no longer contain any other intersection.

Before searching for these subsets, it is necessary to reconstruct the (internal) list of SNOKs and that of the mask_NOKs so as to take account of the output which had been taken as reference.

Next, the search is performed in three phases.

The first phase consists in searching for the list of all the subsets which will involve at least one output from the SNOK list in their definition (primary list).

A subset is tagged by the marker of the current node of this subset.

This list is obtained by scanning the list of nodes. For each node, the logic AND is carried out between the components of the marker and their counterpart (with the same group number) from the mask_NOK list. If at least one of the results of these ANDs is nonzero, the marker of this node defines a relevant subset. We verify that this subset has not already been found before recording it.

At the end of this step, the primary list therefore contains the designation of all the subsets formed from the cones of the SNOKs. Each of the subsets appears therein in a unique manner.

From the programming point of view, this list is a list of structures of the type "listArraysMasks". The "mask" field of these structures is a pointer to the array of integers of type (TYPEMASK) containing, for each group, the result of the above-cited AND operations.

The "inclusion" field serves, in the second phase, to indicate whether the subset contains another subset.

The second phase consists in comparing each element of the primary list with the others.

The comparison consists in testing, for each group, the following conditions:

(mask_of_subset_A)&(mask_of_subset_B)==(mask_of_subset_A).

If this condition is true for all the groups, the subset B is included in A and A must be rejected since it cannot henceforth be a minimal intersection. To signify this rejection, the inclusion field of the structure describing the subset A is set to one.

At the end of this phase, the elements of the list whose inclusion field has not been set to one are the sought-after connected minimal intersections.

If "n" is the number of outputs of the SNOK list, the total number of comparisons to be performed is equal to n(n−1).

The third phase consists in reviewing all the elements of the primary list and, for those whose "inclusion" field is zero, in constructing, from the "mask" field, a text file containing the list of output names relating to this subset.

Each file emanating from the slicing up of the initial file of SNOKs bears a name constructed as follows: "nameInitialListSNOK_slice_number.snok". The program will have to be rerun for each of these slices of the initial list.

The next step, denoted 220, consists of the exclusion of the SOKs and of the inputs.

This involves removing from the intersection the nodes which are members of the USOK (union of cones of the SOKs).

In the program, a distinction is made between exhaustive exclusions and nonexhaustive exclusions.

For the construction of the minimal subset, the "nonexhaustive" mode is used.

In this mode, each of the trees of the intersection is traversed and when a node is a member of the union of the SOKs, the "exclusion" field is set to "one" in the NODE structure attached to it.

The traversing is carried out using the "prefixed order" algorithm and the cuts are cusps and their twin can be excluded if it is a member of the USOK.

To determine whether a node is a member of the USOK, for each element of the mask_OK list, the value of the mask is compared with the element (with the same group number) of the markers array associated with this node. The comparison uses the logic AND. If for one at least of these comparisons the two integers have a counterpart bit equal to one, the node is a member of the USOK. It is therefore necessary to test the veracity of the following conditions: value_marker (group) & value-mask !=0.

The exclusion of the nodes connected to the output of the input cells is carried out, trivially, by scanning the list of pins of the component.

In step 222 a virtual vertex is defined.

The vertices of the minimal subset are linked to a virtual node.

The global variable "vertex_virtual" is a pointer to this node.

The function "create_a_pseudo_vertex( )" creates this node and initializes its fields.

The numbering of the minimal subset, carried out in the next step denoted 224, consists in registering in the "counter_ancestors" field of each node the total number of its ancestors.

A zero number of ancestors is allocated to the excluded nodes and to the cuts.

An excluded node offers a zero contribution to its successor.

A cut offers a contribution of one unit to its successor.

The parents of a node are its immediate ancestors (directly attached).

Figure 16:
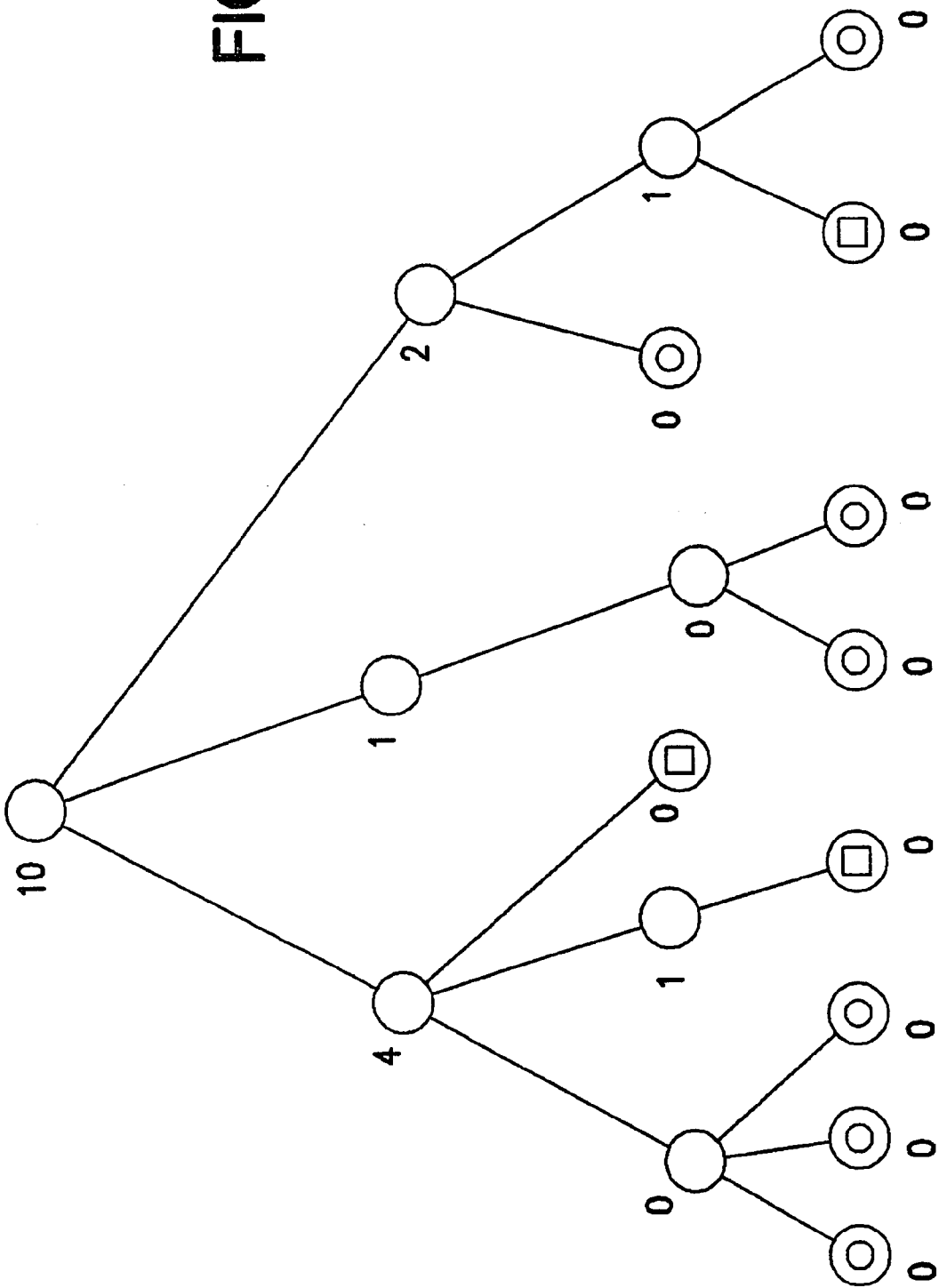
FIG. 16 is a diagrammatic view of a tree giving an example of numbering.

FIG. 16 gives an example of numbering.

This numbering is used in the locating algorithm to propose choices of node to be tested.

To number a tree, this tree is traversed a first time with the standard prefixed-order algorithm and the zero value (initialization phase) is allocated to the "counter_ancestors" fields. In a second phase, the tree is traversed again with the post-fixed order algorithm and the following value is allocated to the ancesters counter of each node:

(sum of the counters of ancestors of the parents of this node+ number of parents of the node)

The next phase of the process, designated by the general reference 124 in FIG. 1, consists of the dichotomy-based search for faults in the minimal subtree.

Accordingly, step 230 firstly determines, according to a criterion which will be explained subsequently, a mean node in the minimal subtree then step 232 performs a physical test on this node if this node is testable. To evaluate whether the node is testable, a verification is performed in step 233. If the response is negative, rather than invoking the tester at 232, a call is made to phase 126 of the process.

The dichotomy algorithm ensures that the search converges to one or more faulty zones. Its simplified principle is as follows:

The algorithm proposes a test on an internal node of the search domain.

This node is chosen in such a way that the number of its ancestors is approximately equal to the mean value of the number of ancestors of the nodes of the search domain which have not yet been tested.

If the signal on this node is normal, this node is eliminated from the search as are all its ancestors.

This is based on the assumption that if a node is not a fault propagation point then neither are its ancestors, which are the nodes which might influence it.

Hence, an exponential-like reduction of the search zone is thus obtained.

If the signal on the node tested is abnormal, this node belongs to a faulty zone. It is then taken as new starting point for the searches.

Since certain nodes are not testable and since the nodes found to be bad are not necessarily vertices of faulty zones, consistency tests are necessary before being able to determine the limits of a faulty zone. The presence of these consistency tests, embedded in the dichotomy, singularly complicates the algorithm. The latter is described in detail in the subsequent description.

The minimal subset in which the search for the faults is conducted is a set of disjoint trees. The vertices of these trees form the list of parents of a virtual node intended to manipulate the minimal subset globally.

Depending on the test means used, a limit depth of testability of the nodes (depth_max) is specified.

According to the layout of the circuit, the specified limit depth may make some of the nodes untestable (including the parents of the virtual node).

Moreover, some of the nodes can be declared untestable independently of their depth.

The terminations, testable or otherwise, of the minimal subset may be:

Cuts;

Output nodes (already excluded) of input Cells;

USOK boundary nodes (already excluded).

Each node is assigned a variable containing the total number of its ancestors. The cuts and the input nodes have a zero number of ancestors.

The characters of the virtual node are, by convention:

Untestable

Faulty

Nonexcluded

Furthermore, the following data are also implemented by the program:

The list of already tested internal nodes (optional list). This list is automatically supplemented by the program as and when new tests are performed. If it is nonexistent, the program creates it.

A list (optional) of nodes which the operator, for various reasons, considers to be untestable.

The file (optional) giving the "metal level" of each of the internal nodes to be tested. Any node not cited in this list is considered, by default, to be at the "metal 1" level. If the list does not exist, all the nodes are considered to be at the "metal 1" level.

Specifically, a given node is always situated on an interconnection "track". In general, the interconnection tracks are distributed over "levels" situated at varous depths. These interconnection levels are separated by insulating layers ($SiO_2$, $Si_3N_4$, etc).

The first interconnection level called "metal 1" is, by convention, the one closest to the surface. The last is the one which is closest to the semiconductor. The program supports 253 levels but this number could be extended without any problem.

Measuring the state of a node using a tester presupposes that this tester is able to probe the circuit down to the interconnection depth associated with this node. For a given tester, there is therefore a limit of visibility of the nodes. This limit of testability is called the "maximal test depth" ("depth_max" variable in the code). It must be specified by the user according to the test means used.

The (optional) files employed are:

A file giving the depth of the nodes (metal level =1 by default)

A file of untestable nodes (only the specified nodes are untestable)

A file of already tested nodes (which is created by the program if it is nonexistent) The search parameters are:

The maximal test depth

The criterion for stopping the searches (a faulty cell or a faulty zone or all the faulty parts).

The search algorithm is based on the dichotomy principle. Generally, it ensures that the search converges to one or more faulty zones.

The algorithm proposes a test on an internal node of the search domain. This node is chosen in such a way that the number of its ancestors is approximately equal to the mean value of the number of ancestors of the nodes of the search domain which have not yet been tested. The chosen node is said to be the "mean node".

This node must, moreover, satisfy the following constraints:

It must be testable;

Not have already been found to be faulty

Must not be a vertex of a faulty zone

Must not be excluded

Must not be the ancestor of a node excluded following a test

Must not be the ancestor of a vertex of a faulty zone

The response concerning the result of the test of the signal on this node may be supplied automatically by the tester or else be entered into the keyboard by the operator.

If the signal on this node is normal, this node is eliminated from the search as are all its ancestors.

To eliminate this node, it is excluded, as are all its ancestors, by setting to one the "exclusion" fields of the data structures associated with these nodes (so-called exhaustive exclusion). Once this exclusion has been effected, the minimal subset is renumbered (as a number of ancestors) from the virtual vertex, so that the new calculation of mean node no longer takes account of the new excluded nodes.

If the signal on the node tested is abnormal, this node is downstream of a faulty zone. It is then taken as new starting point for the searches.

The programming technique adopted is recursive. The same function is used with certain input parameters inherited from the previous context. In particular, the vertex of the search is now the node whose signal was declared to be bad.

No recurrence is performed on a cut. It is merely marked bad if the signal is bad on its twin node.

On repeating each recurrence, according to the decisions taken with regard to the specified stopping criterion, the function can be exited or else one can continue to search among the proposable nodes which have not yet been tested.

When the search must be continued, that is to say when one wishes to find all the faulty zones or else the nodes which have tested bad and the consistency tests performed do not make it possible, at this juncture, to declare a zone faulty.

Consistency tests are necessary before being able to determine the limits of a faulty zone.

This is related to the fact that certain nodes are not testable and that the nodes found to be bad are not necessarily vertices of faulty zones.

The consistency tests and the tests of the veracity of the specified stopping criterion are performed during the "post-exhaustion analysis" phase 126.

The first call to the search algorithm is made from the virtual vertex of the minimal subset. The initial search zone is therefore the minimal subset.

Figure 17:
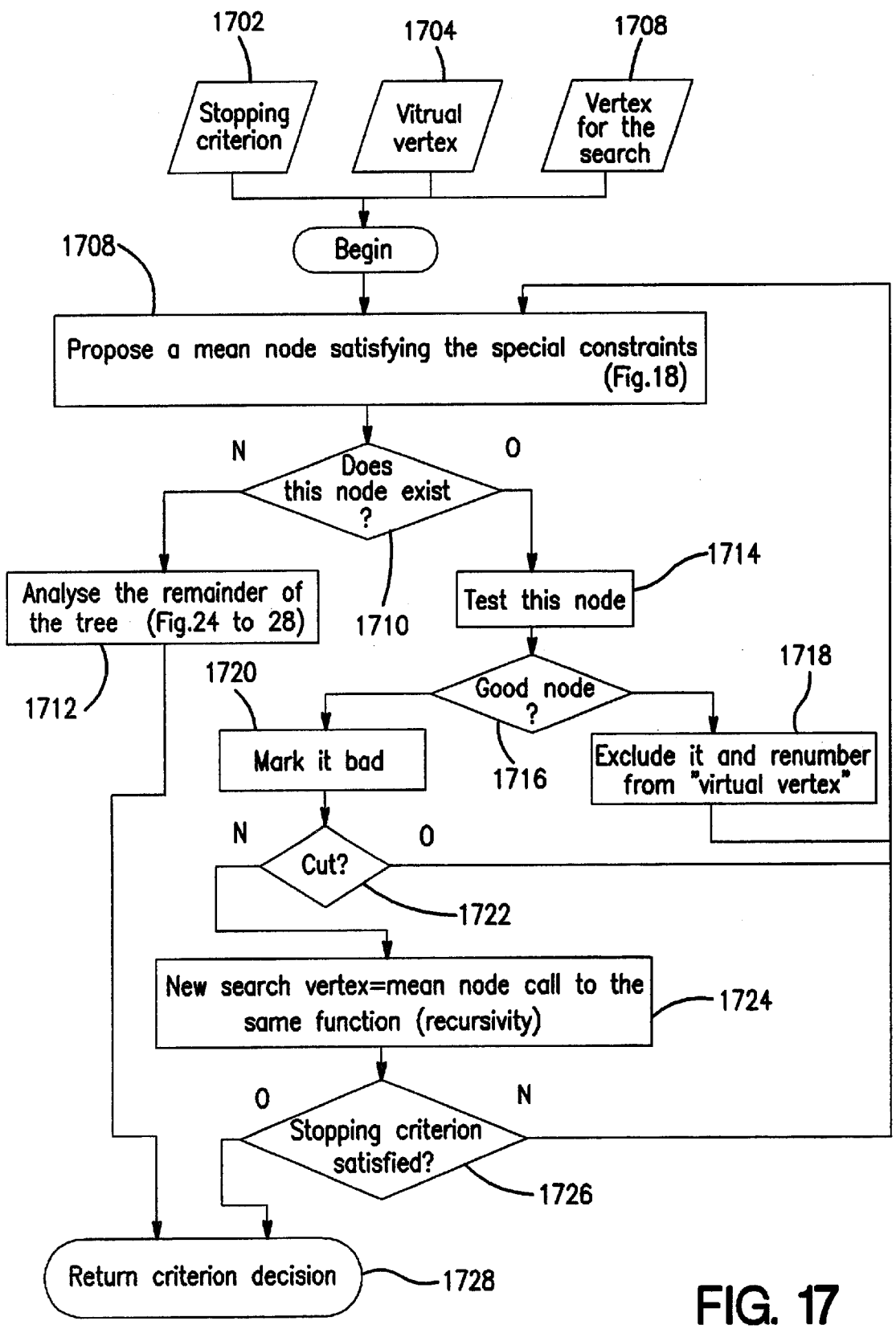
FIG. 17 is a flow chart explaining the algorithm for searching for defective elements through the function dichotomy( )

The search algorithm constituting the dichotomy( ) function is explained in the flow chart of FIG. 17.

The dichotomy( )function receives as input the stopping criterion 1702, the virtual vertex 1704 of the tree on which it is operating and also the vertex 1706 of the search.

In step 1708, a mean node satisfying the specified constraints is proposed. This mean node is determined as will be explained subsequently by implementing the function search_node_mean( ) set out with regard to FIG. 18.

Step 1710 verifies that this mean node exists. If such is not the case, step 1712 is implemented during which the remainder of the tree is analysed without implementing the tester. Accordingly, the function analyse_cells_remaining( ) is implemented so as to attempt to slice up the remaining set of nodes in a faulty zone. The function analyse_cells_remaining( ) will be described subsequently with regard to FIG. 23, taking into account the algorithms which it implements and which are described in FIGS. 24 to 28.

If on the other hand step 1710 reveals that a mean node satisfying the specific constraints exists, this node is tested in step 1714 by implementing the tester.

Accordingly, a sequence of predetermined tests is applied to the input terminals of the integrated circuit and the signal obtained at the measurement point corresponding to the mean node determined in step 1708 is measured and compared with the theoretical signal which ought to be obtained at this point.

If the measured signal is identical to the theoretical signal which ought to be obtained, the node is considered to be good. Otherwise, the node is considered to be bad.

Following the tests carried out in step 1716, if the node is good it is excluded in step 1718 and the search tree is numbered from the virtual vertex defined at 1704. Step 1708, as well as the subsequent steps, are reimplemented on just that part of the tree obtained after excluding the previously tested mean node.

If on the other hand in step 1716 the node is detected as bad, the latter is marked as bad in step 1720. The subsequent step 1722 consists in verifying whether the node marked bad is or is not a cut. If such is the case, another node of the tree is tested by a new implementation of steps 1708 et seq.

On the other hand, if the node marked bad is not a cut, this node becomes in step 1724 the new search vertex serving for a new recursive implementation of the function dichotomy( ) applied with the mean node previously considered as bad as new search vertex at 1706.

On completion of the recursive application of the function dichotomy( ) in step 1724, step 1726 tests whether the stopping criterion considered at 1702 is or is not satisfied. As long as this criterion is not satisfied, new mean nodes are proposed in step 1708 and tested in the subsequent steps. As soon as the stopping criterion is satisfied in step 1726, the dichotomy function is halted in step 1728 and the result of the analysis is made available to the user.

The search for the mean node carried out in step 230 of FIG. 2 corresponding to step 1708 of FIG. 17 is performed in two phases.

In the first phase denoted 234, we traverse the tree in which the search is performed and we calculate the mean value of the number of ancestors.

In the second phase denoted 236, we traverse the tree and we search for the node whose number of ancestors is closest, from below, to the mean value calculated at the conclusion of the first phase.

A cut indicator for the mean node proposed is also given.

Figure 18:
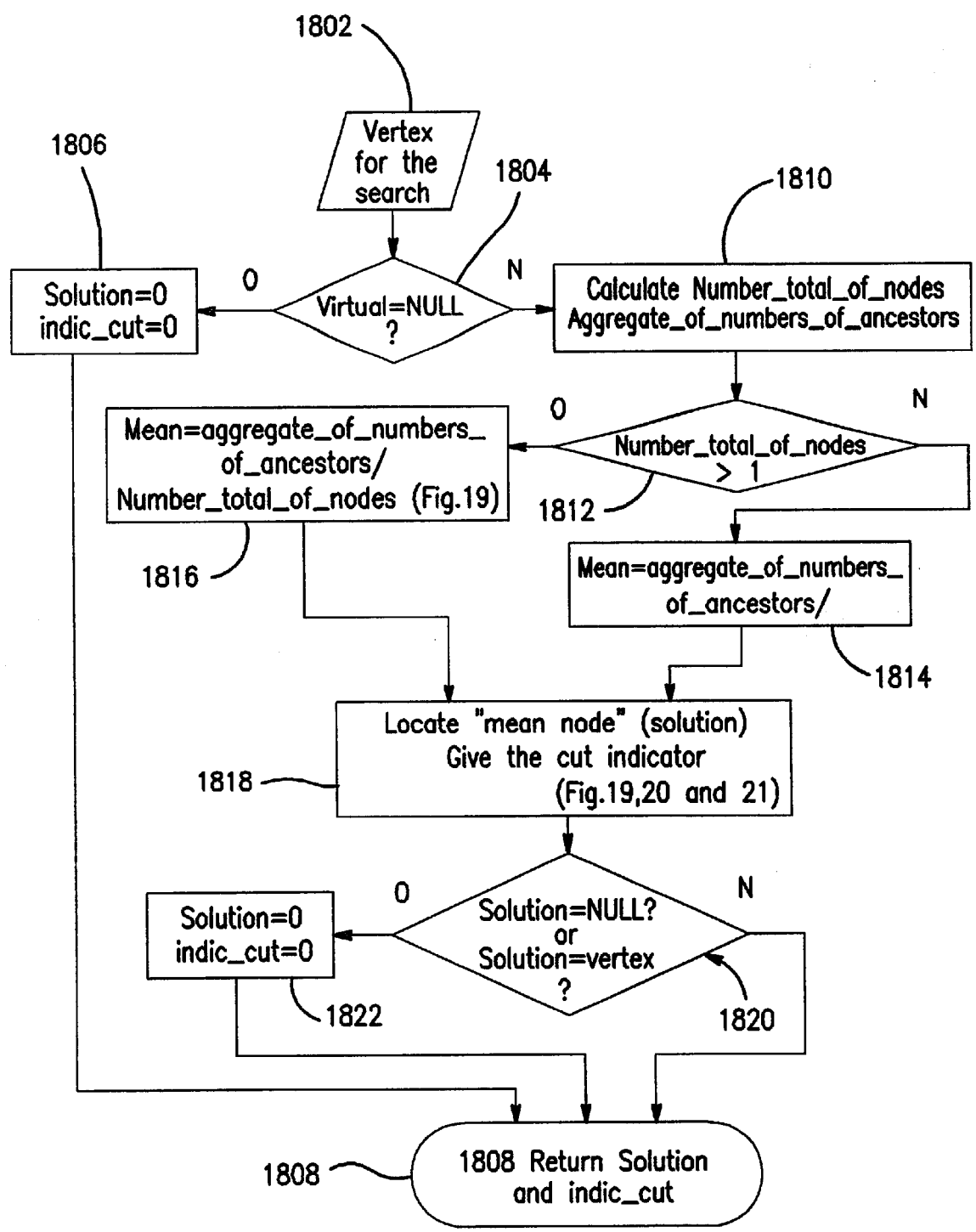
FIG. 18 is a flow chart explaining the calculation and the locating of a mean node through the function search_node_mean( )

The function search_node_mean( ) which ensures the coordination of these two phases is described with regard to FIG. 18 in the flow chart for the calculation and location of the mean node. The functions relating to the two phase are described in the following paragraphs, with regard to FIG. 19, and FIGS. 19, 20 and 21 respectively.

The function search_node_mean( ) implemented in step 1708 employs as input, at 1802, the vertex of the search, that is to say the vertex of the tree in which the search for the mean node is performed. In step 1804, a test is performed to determine whether this vertex is NULL, that is to say whether the tree is empty. If such is the case, in step 1806 the solution variable is fixed at 0, as is the variable indic_cut. The result of the function is returned in step 1808 with the values associated with solution and indic_cut. The definitions of solution and indic_cut will be given in the subsequent description with reference to FIGS. 20 and 21.

On the other hand, if the tree is not empty, that is to say if the vertex tested in step 1804 is non null, step 1810 is implemented by applying the function calculation_mean( ) which will be described with reference to FIG. 19. During this step, the total number of nodes of the tree is calculated by traversing the latter. Likewise, the calculation of the aggregate of the numbers of ancestors is performed. The result of these calculations is registered respectively in the variables number_total_of_nodes and aggregate_of_numbers_of_ancestors.

During the test of step 1812, the number_total_of_nodes is compared with the value 1. If the number_total_of_nodes is equal to 1, the mean is taken equal to the aggregate_of_numbers_of_ancestors in step 1814.

On the other hand, if the number_total_of_nodes is greater than 1, the mean is calculated in step 1816.

Regardless of the mode of calculating the mean in step 1814 or 1816, the algorithm proceeds in step 1818 to the locating of the mean node, making it possible to determine the solution variable as well as the cut indicator denoted indic cut. The algorithm for locating the mean node will be described subsequently with reference to FIG. 19 modified in accordance with FIGS. 20 and 21.

In the subsequent step 1820, the solution obtained for the mean node in step 1818 is compared with the particular values NULL and vertices. If the solution variable is equal to one of these values, the variables solution and indic cut are fixed at 0 in step 1822. In all cases, step 1808 is finally implemented making available the result of the function search_node_mean( ).

Figure 19:
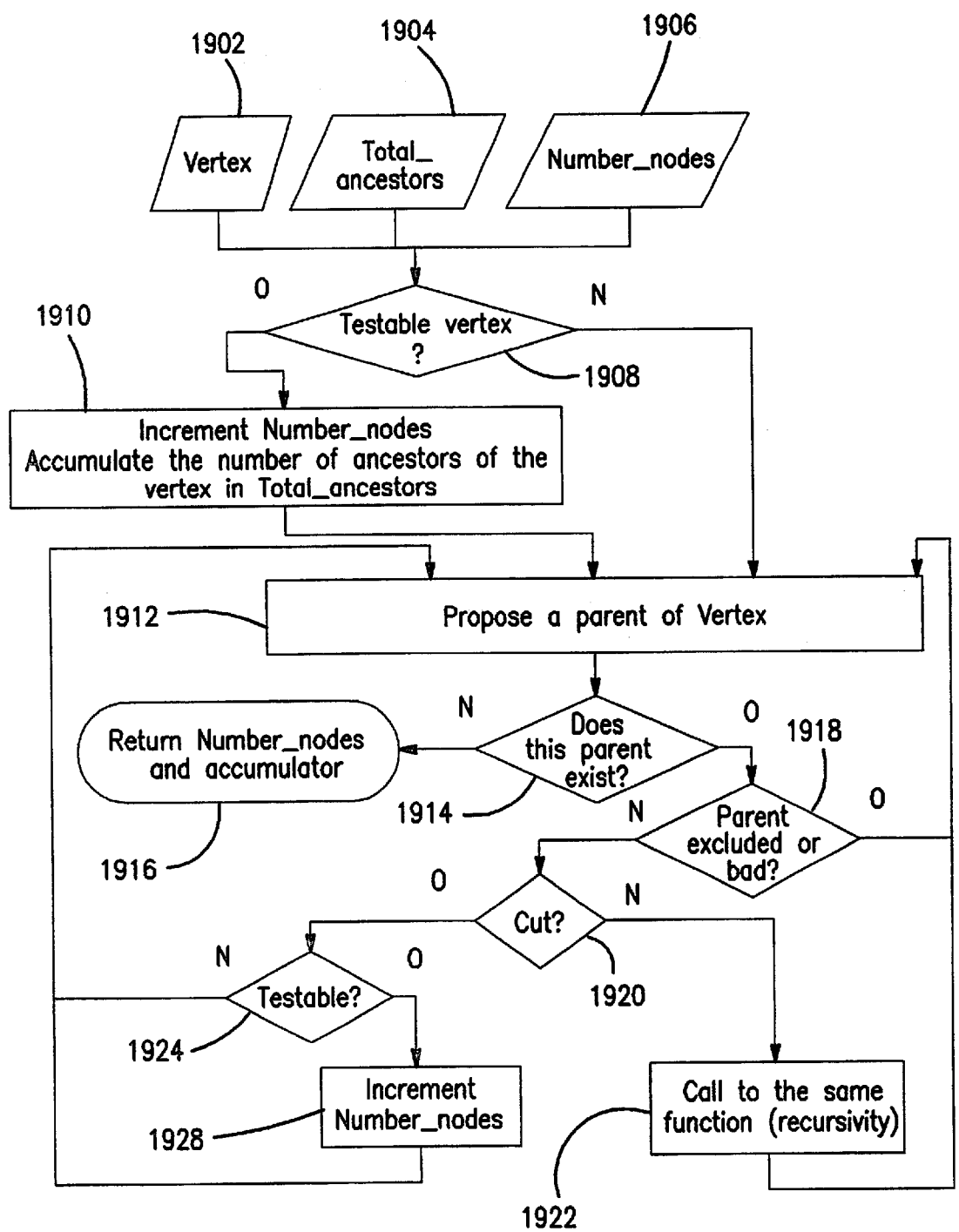
FIG. 19 is a flow chart explaining the calculation of the number of nodes and of the aggregate of the ancestors through the function calculation_mean( )

The function calculate_mean( ) described in FIG. 19 employs as input the vertex 1902 of the tree considered, the total of the ancestors of this tree 1904, and also the number of nodes 1906 of the tree considered.

Step 1908 verifies that the vertex considered at 1902 is testable. If such is the case, in step 1910, the variable number_nodes is incremented and the number of ancestors of the vertex is aggregated in the variable total_ancestors.

Whether or not the vertex considered at 1902 is testable, the subsequent step 1912 consists in proposing a parent of the vertex, in order to traverse the tree progressively. If during the test performed in step 1914 it is noted that there is no parent at the vertex considered, the function calculate_mean( ) is halted in step 1916 and the results of the function, namely the variable number_nodes and the accumulator are returned.

On the other hand, if during the test of step 1914 the parent proposed for the vertex exists, step 1918 verifies that this parent is excluded or bad. If such is the case, step 1912 is implemented again.

If such is not the case, step 1920 tests whether the parent considered is or is not a cut. If it is not a cut, the function calculate_mean( ) is implemented recursively in step 1922. On completion of this recursive implementation, step 1912 for proposing another parent of the vertex considered is executed again.

On the other hand, if in step 1920 it is concluded that the parent considered is a cut, step 1924 verifies whether this cut is or is not testable. If it is not testable, a new parent is proposed in step 1912. If this cut is testable, the variable number_nodes is incremented in step 1926, before a new parent of the vertex is proposed in step 1912.

For the calculation of the mean in step 234 of FIG. 2 corresponding to step 1810 of FIG. 18, we traverse the tree and, for each relevant node, the number of its ancestors is aggregated in an accumulator and a nodes counter is incremented.

The excluded nodes or the nodes which were tested as bad are ignored as are their ancestors. The recurrence occurs with regard to the relevant nodes which are not cuts. The untestable cuts are ignored. The testable cuts give rise only to the incrementing of the nodes counter (number of ancestors which is null).

For the first call of the function, the accumulator and the nodes counter and initialized to zero.

For the first call, the given vertex must not be an excluded node.

The detailed algorithm for calculating the number of nodes and for aggregating the ancestors constituting the function calculate_mean( ) is given in the flow chart of FIG. 19.

The procedure for locating the mean node in step 236 of FIG. 2 corresponding to step 1818 of FIG. 18 is similar to the previous procedure with a few adaptations.

The name of this procedure is: locate_mean( ).

Figure 20:
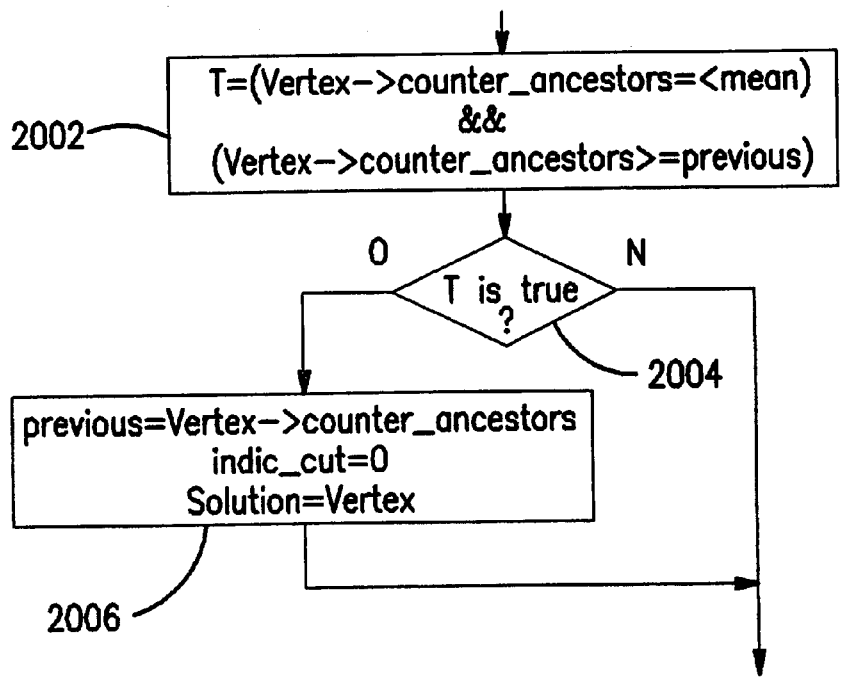
FIGS. 20 and 21 are flow charts explaining the modified elements of the algorithm of FIG. 19 for the locating of a mean node through the function locate_mean( )
Figure 21:
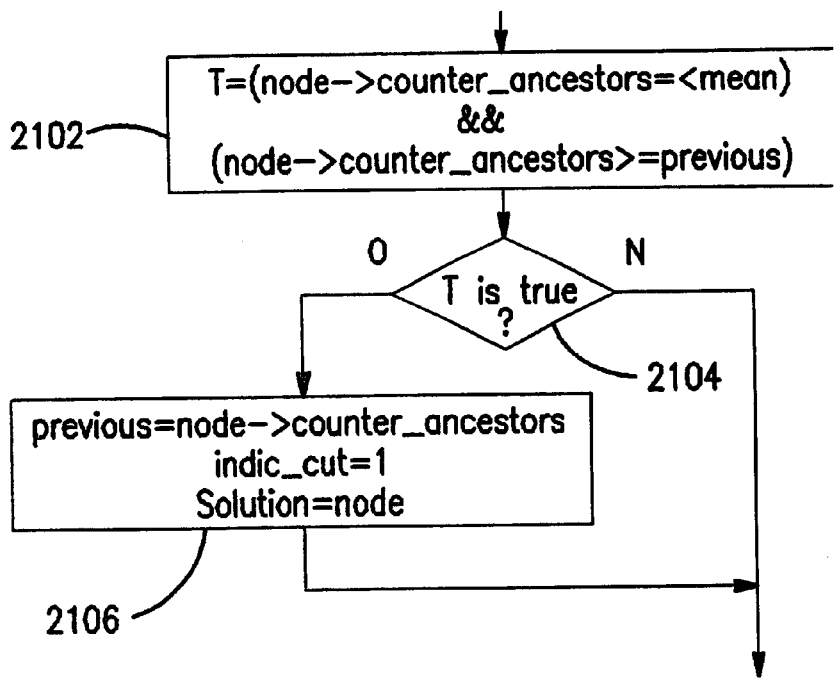

To obtain the flow chart of the function locate_mean( ), it is sufficient to replace step 1910 by the block of FIG. 20, and step 1926 by the block of FIG. 21.

Moreover, the input parameters are: Vertex, mean, solution, indic_cut and "previous". The parameter "previous" is the latest best approximate value found for the number of ancestors of the mean node. The first call of the function is made with previous=0.

Solution is the best node found and indic_cut its cut indicator.

The nodes already declared as vertices of faulty zones are not proposed as mean nodes since they are interpreted as bad nodes and discarded.

More precisely, and as represented in FIG. 20, when in step 1908 the vertex is considered to be testable, a logical variable T is calculated in step 2002. This is given by:

$$T = (\text{vertex} \rightarrow \text{counter\_ancestors} = \; < \text{mean})$$
$$\& \; \&$$
$$(\text{vertex} - \text{counter\_ancestors} >= \text{previous}).$$

A test of the value of the variable T is performed in step 2004. If this variable is false, a new parent of the vertex is proposed in step 1912.

On the other hand, if the variable T is true, then in step 2006, the values of the previous variables indic_cut_vertex are modified as indicated below:

$$\text{previous} = \text{Vertex} \rightarrow \text{counter\_ancestors}$$
$$\text{Indic\_cut} = 0$$
$$\text{Solution} = \text{Vertex}$$

Likewise, as replacement for step 1926, and as represented in FIG. 21, a logical variable T is firstly defined in step 2102. It is defined by:

$$T = (\text{node} \rightarrow \text{counter\_ancestors} = \; < \text{mean})$$
$$\& \; \&$$
$$(\text{node} \rightarrow \text{counter\_ancestors} >= \text{previous})$$

In step 2104, the logical value of the variable T is tested. If the latter is false, a new parent of the vertex is proposed in step 1912.

On the other hand, if the variable T is true, in step 2106, the values of the previous variables, indic_cut and solution are modified as indicated below:

$$\text{Previous} = \text{node} \rightarrow \text{counter\_ancestors}$$
$$\text{Indic\_cut} = 1$$
$$\text{Solution} = \text{node}$$

After determining the mean node, the test of the latter is carried out by invoking the tester in step 232 of FIG. 2, corresponding to step 1714 of FIG. 17 with the function test_node( ). This function has the address of the node to be tested as call parameter.

Before invoking the tester, this function verifies whether the node has not already been tested by analysing the content of the file of nodes tested. If the result is known, it is used immediately in the program. In the converse case, this function interrogates the tester with regard to this node. The response of the tester, independently of its use in the program, is archived in the file of nodes tested. This avoids, if the program has to be restarted, having to perform tests on these nodes again.

The response provided if the node is operating correctly is "1". If the node is found to be faulty, the response must be "0".

The tester is invoked by way of the function interrogate_tester( ). This function writes the name of the node to be tested to a text file and will periodically read back the content of this file. When the tester has responded, the function returns the response to the function test_node( ).

The name of the interface file (absolute or relative) is defined in the header file "general.h". The other parameters involved in checking the tester (duration between two readings of the interface file and overshoot of time regarding the tester response) are also defined in this file.

The operations of writing to and reading from the interface file require no synchronization between the tester and the program.

Consistency checks with regard to the name of the node and to the response of the tester are performed in the function interrogate_tester( ) at each test.

The dialogue between the tester and the program follows the following protocol:

The program empties or creates the interface file and on the first line it writes the name of the node to be tested without going onto the next line.

It is presumed that the tester will read this file periodically. As soon as it detects the presence of a new node name, it performs the test and responds (in "append" mode) by going onto the next line followed by the integer 0 or 1 not followed by going onto the next line.

The program will periodically read the interface file. As soon as it detects the additional line, it knows that the tester has responded and the content of this line is interpreted numerically by the standard function "fscanf( )" of the C language.

The flows from the interface file to the program and the tester are distinct and may be simulated.

A program "pseudo_tester" can be run in the background (option & of the shell). It enables the interface file to be written manually. The operator can thus respond at the keyboard instead of the tester.

Three flows (the program, the tester and the pseudo_tester) can thus simultaneously access the interface file.

To write the tester access program to the interface file, we can start from the "pseudo_tester.c" source file and from the associated headers.

The dichotomy algorithm is implemented until the minimal subtree is depleted. The post-depletion analysis of a level which is the subject of phase 126 in the flow chart of FIG. 1 is requested by the dichotomy algorithm when there is no longer any proposable node to be tested.

We must then attempt to slice up the remaining set of nodes into faulty zones.

According to the chosen stopping criterion and the result of the slicing attempts, we retrieve either the value 0 (criterion not satisfied) or the value 1 (criterion satisfied).

For a given context of the dichotomy algorithm, when all the proposable nodes have been depleted, the ends of the subtree analysed can only be:

Output nodes of input cells. These nodes are already excluded from the start. They will be dubbed "input nodes";

USOK boundary nodes (already excluded from the start);

Excluded cuts;

Cuts which tested bad;

Untestable cuts.

The remaining internal nodes may be:

Untestable nodes;

Nodes declared to be "vertex of faulty zone";

Nodes which tested bad but are not declared to be "vertex of faulty zone".

Remarks:

There cannot exist any untestable end which is neither an input, nor a USOK boundary, nor a cut.

The vertext of the tree to be analysed can only be a testable node found to be bad (it cannot be a cut).

The ancestors of a vertex of faulty zone are considered no longer to be accessed subsequently.

To decide whether a zone is faulty, we shall refer to the definition given with regard to FIG. 5. It follows from this definition that the presence of cuts which tested bad or of untestable cuts constitutes an obstacle to declaring a zone faulty. It is therefore necessary to analyse the environment of these cuts in the remainder of the tree so as to remove the doubt whenever possible. This operation is dubbed "resolution of the cuts". It consists in searching as to whether the cuts present have their twin node in the current search zone.

Figure 22:
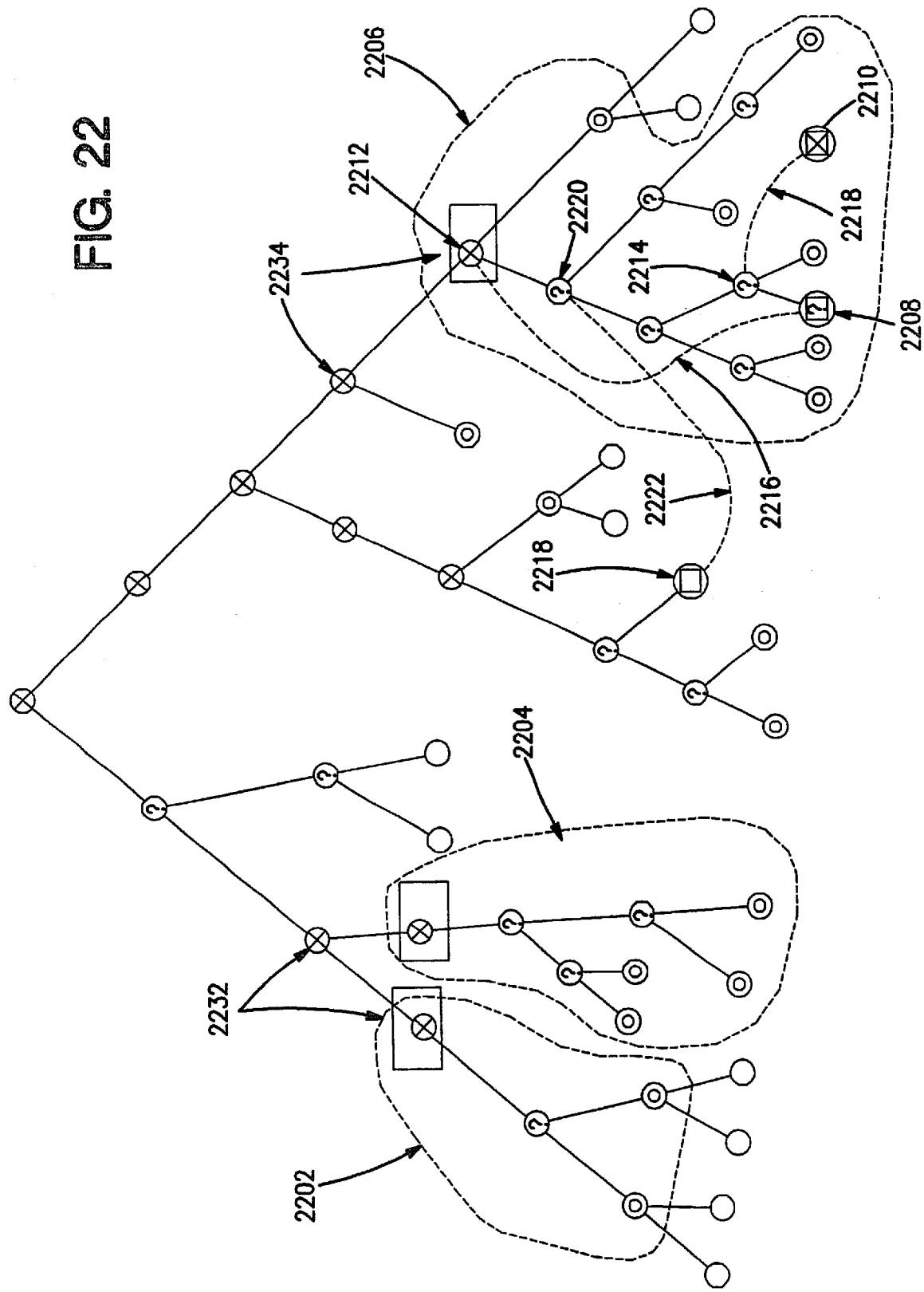
FIG. 22 is a view of a tree illustrating examples of permitted and disallowed resolutions.

Given in FIG. 22 is an example of permitted and disallowed resolutions, an example of the "embedding effect" and an example of three separable faulty zones. The "embedding effect" will be defined in the subsequent description.

The nodes of the tree which are represented in FIG. 22 are differentiated by reusing the graphical conventions used hitherto. Thus, the bad nodes are designated by a nought at the centre of which is a cross. The untestable nodes are designated by a nought inside which is a question mark, the good nodes are. designated by a nought inside which is another nought, and the cuts are designated by a nought inside which is a square.

The cuts constituting untestable nodes or bad nodes exhibit internally a cross and a question mark respectively, in addition to a square.

In the tree of FIG. 22, three faulty zones designated by the references 2202, 2204 and 2206 are surrounded by a dashed cordon. By definition these faulty zones exhibit a vertex consisting of a bad node, which for reasons of clarity has been framed with a rectangle. These bad nodes have as parent at least one untestable node and possibly good nodes.

The three faulty zones are separate since they have no common node.

Inside the faulty zone 2206 are two cuts 2208 and 2210. These cuts correspond to nodes which are respectively the twins of the nodes 2212 and 2214. The associating of the cuts with their twin nodes is represented by a dashed bond 2216 and 2218.

In so far as the cuts 2208 and 2210 have their twin nodes within one and the same limit of faulty zone 2208, resolution is permitted.

On the other hand, the cut denoted 2218 having the node 2220 as twin node, as indicated by the dashed bond 2222, is situated outside the limit of faulty zone 2206.

It is therefore unnecessary to attempt to resolve this cut by internal access to the zone declared faulty 2206, given that the faulty zone which could result therefrom would include the first anyway without, apparently, affording additional information.

Moreover, a zone must not be declared faulty if at least one of its terminations is a vertex of a zone already declared to be faulty. This phenomenon is referred to as the "embedding effect". The algorithms described below are suitable for detecting it and taking it into account.

Examples of embedding effects identified by the references 2230 and 2234 appear in FIG. 22 at the vertices of the faulty zones 2202 and 2206.

In the subtree in which the remaining analysis of the nodes is carried out, a cut (bad or untestable) may be connected to:

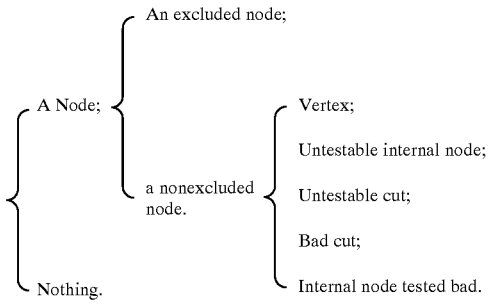

However, there are, by definition, impossibilities. The possible and impossible cases are summarized in the following table:

The resolution impossibilities are tagged by the letter "I"; they are due to "good/bad" conflicts or "testable/untestable" conflicts. The letter "P" indicates that the resolution of the connection is possible.

|  |  | Bad cut | Nontestable cut |
|---|---|---|---|
| Connected to: | Excluded node | I | P |
|  | Vertex | P | I |
|  | Nontestable internal node | I | P |
|  | Nontestable cut | I | P |
|  | Bad cut | P | I |
|  | Nothing | P | P |
|  | Bad internal node | P | I |

This leads to the following table which summarizes the possibilities of resolution of the cuts. The letters "R" indicate that the cut can be resolved; the letter "D" indicates that the doubt cannot been removed.

The empty boxes correspond to impossible resolutions.

|  |  | Bad cut | Nontestable cut |
|---|---|---|---|
| Connected to: | Excluded node |  | R |
|  | Vertex | R |  |
|  | Nontestable internal node |  | R |
|  | Nontestable cut |  | D |
|  | Bad cut | D |  |
|  | Nothing | D | D |
|  | Bad internal node | R |  |

To summarize, the resolution criterion can be stated:

A cut tested bad will be resolved if it has as twin (in the zone to be analysed) the vertex or an internal node tested bad.

A untestable cut will be resolved if it has as twin (in the zone to be analysed) an excluded node (USOK boundary or input node) or an untestable internal node.

The analysis of the remaining nodes therefore consists in drawing up the list of candidates which may be declared to be vertex of a faulty zone. For each of these candidates, the subtree of which it is the vertex is analysed by applying the criterion for resolving cuts. The resolution of all the cuts under this node is the necessary but not sufficient condition for the zone to be declared a faulty zone.

Figure 23:
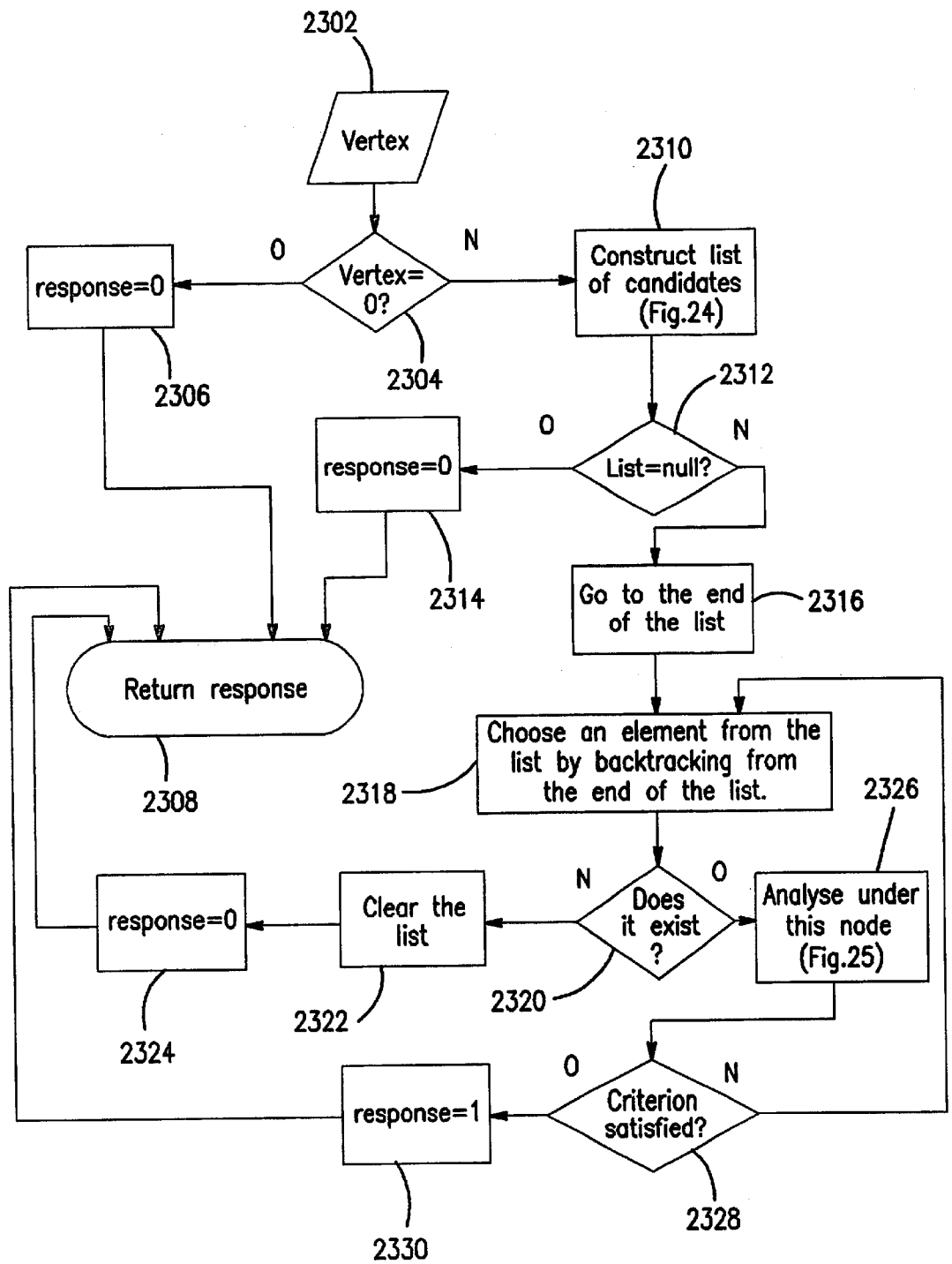
FIG. 23 is a flow chart explaining the determination of the nodes which may be declared vertex of a faulty zone through the function analyse_cells_remaining( )

The detailed algorithm for the post-depletion analysis constituting the function analyse_cells_remaining( ) is given in the flow chart of FIG. 23.

The function analyse_cells_remaining( ) employs as input the vertex 2302 of the tree considered.

The value of this vertex is tested in step 2304. If this vertex is NULL, the response variable is fixed at 0 in step 2306 and the value of the response variable is returned in step 2308 as result of the function analyse_cells_remaining( ).

On the other hand, if the vertex is different from NULL in step 2304, the list of candidates for resolution is constructed in step 2310 by implementing the function construct_list_candidates which will be described with regard to FIG. 24.

During the test performed in step 2312, if the list of candidates is null, then the value of the response variable is fixed at 0 in step 2314 then step 2308 is implemented.

On the other hand, if the list is non null, the end of the list is considered in step 2316, then in step 2318 an element of the list is chosen by backtracking through it.

If during the test performed in step 2320 it is found that no element can be chosen, the list is cleared in step 2322 and the response variable is fixed at 0 in step 2324 before step 2308 is performed.

On the other hand, if an element of the list can be chosen, then step 2326 analyses the nodes situated under this node then considered as at the vertex. This analysis is performed by implementing the function analyse_under_this_vertex( ) which will be described subsequently with reference to FIG. 25.

After the analysis under the chosen node, step 2328 verifies whether the criterion is or is not satisfied. If such is not the case, steps 2318 and those following it are implemented again. Conversely, if the criterion is satisfied in step 2330, the response variable is fixed at 1 before this response is returned in step 2308.

When a given context of the recurrences of the dichotomy algorithm prevails and when the phase for analysing the remainder of the tree is executed, we are concerned with finding any zones which may be declared Faulty. The various candidates which can assume the role of vertex in respect of these zones are the nodes which have tested bad and have not yet been declared vertices of a faulty zone.

To have faulty zones of minimum size, we must search for the vertices of these zones from among the nodes which have tested bad and are closest to the inputs and then backtrack towards the vertex.

Initially, the list of these candidates is constructed in step 240 of FIG. 2 corresponding to step 2310 of FIG. 23. To do this, the tree is traversed according to the "post-fixed" order procedure while ignoring the excluded nodes, the cuts and the vertices of faulty zones as well as their ancestors. Only the vertices tested as bad and which are encountered are recorded.

The list constructed must be read back from the end to the beginning list by using the reverse traversal pointer.

The list in fact comprises at least one element, namely: the vertex.

Figure 24:
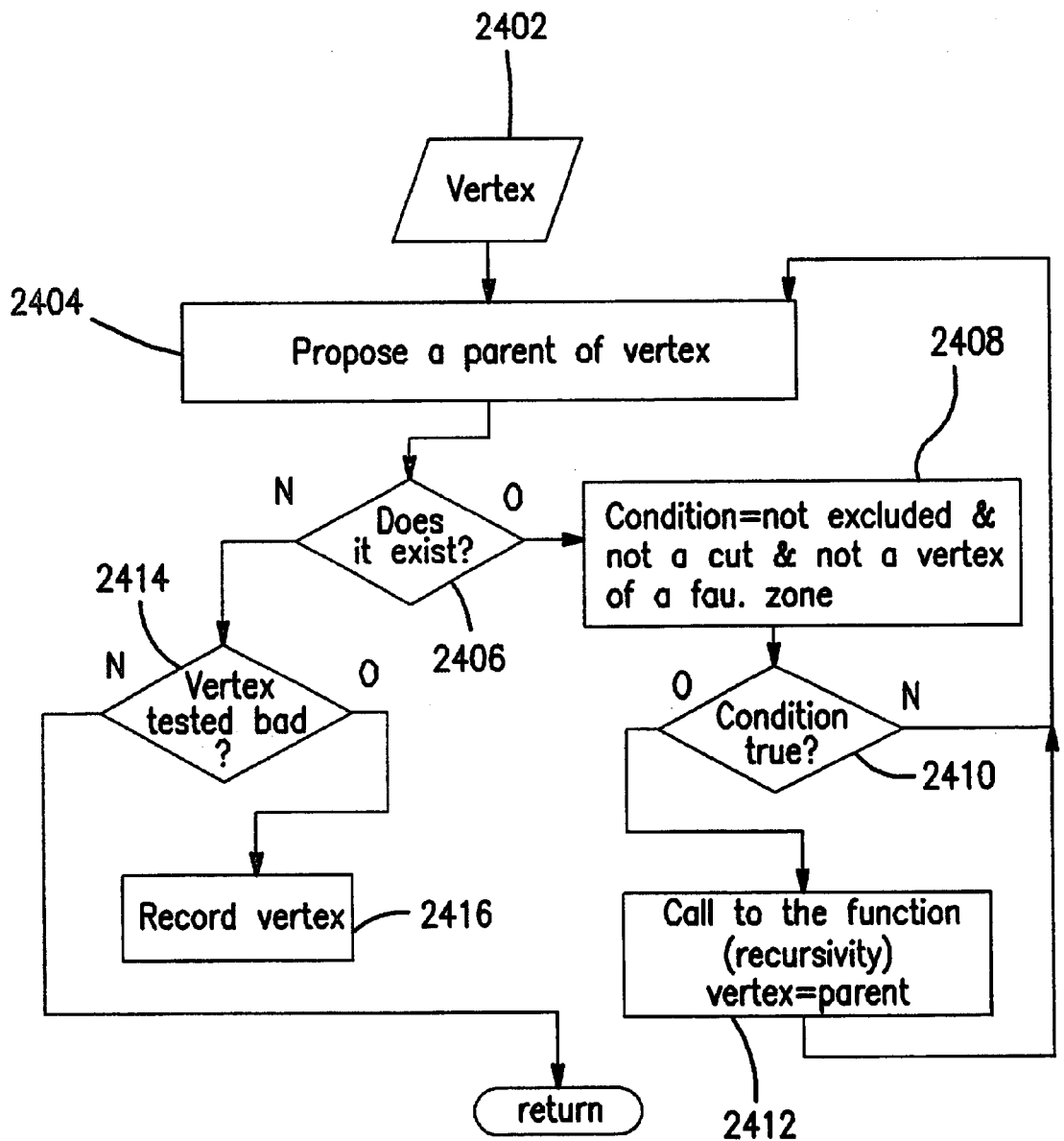
FIG. 24 is a flow chart explaining the construction of the list of candidates through the function construct_list_candidates( )

The detailed algorithm for constructing the list constituting the function construct_list_candidates( ) is given in the flow chart of FIG. 24.

The function construct_list_candidates( ) receives as input the vertex 2402 of the tree considered. In step 2404 a parent of the vertex is proposed. It is verified during the test of step 2406 whether such a parent exists. If this parent exists, a logical variable denoted condition is defined in step 2408. This variable is defined by:

Condition=nonexcluded & noncut & nonvertex of fau-.zone.

This variable condition makes it possible to test whether the parent considered is neither excluded, or a cut, nor the vertex of a faulty zone.

In step 2410 the boolean value of the condition variable is assessed. If the latter is false, that is to say if the parent considered is either excluded, or a cut or the vertex of a zone of definition, a new parent is proposed. If the condition variable is true, that is to say if the node considered is not excluded, is not a cut and is not the vertex of a faulty zone, a new recursive call to the function construct_list_ candidates with the parent considered as variable is performed in step 2412. A new parent is proposed again in step 2404 at the conclusion of step 2412.

When it is no longer possible to propose parents, the response to the test of step 2406 is negative. In this case, step 2414 verifies whether the vertex tested is or is not bad. If such is the case, the vertex is recorded in step 2416 before completion of the function. Otherwise, the function construct_list_candidates( ) is completed without recording the vertex considered.

The analysis under a vertex performed in the subsequent step 242 of FIG. 2 corresponding to step 2326 of FIG. 23 consists in determining whether the cuts lying under a vertex can be resolved.

Initially, the list of cuts is established in step 244, and the possible presence of untestable nodes and the possible presence of an embedding effect are detected.

Once this list has been established, step 246 attempts to resolve the cuts. Depending on the result obtained, the specified stopping criterion is tested and we return to the call context.

The determination of the decision is achieved as follows:

If the stopping criterion is "a faulty cell", decision=1 if, simultaneously, all the cuts are resolved, all the internal nodes of the zone are testable and if there is no embedding effect. In the converse case, decision=0.

If the stopping criterion is "a faulty zone", decision=1 if, simultaneously, all the cuts are resolved and if there is no embedding effect. Decision=0 in the converse case.

If the stopping criterion is "all", decision=0 regardless of the analysis.

Figure 25:
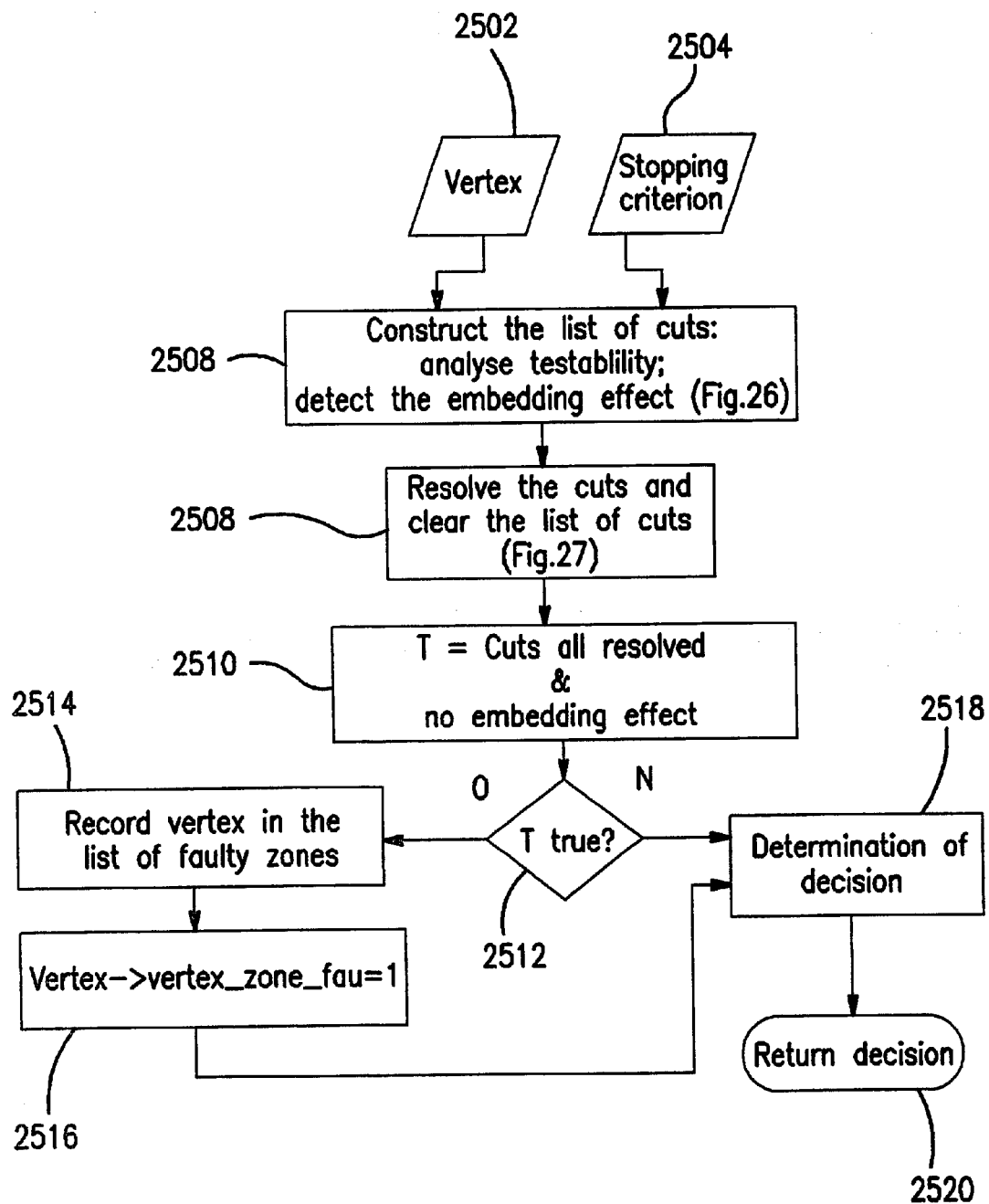
FIG. 25 is a flow chart explaining the analysis under a vertex node through the function analyse_under_this_vertex( )

The detail of the algorithm for analysis under a vertex node constituting the function analyse_under_this_ vertex( ) is given in FIG. 25.

The function analyse_under_this_vertex( ) receives as input the vertex 2502 of the tree considered as well as a stopping criterion 2504.

The first step 2506 consists in constructing the list of cuts, analysing its testability and detecting whether or not there is an "embedding effect". This step is carried out by implementing the function list_cuts_to_be_resolved( ) which will be described in detail with regard to FIG. 26.

On completion of this step, the cuts are resolved in step 2508 and the list of cuts is cleared. This resolution of the cuts is performed by the function resolve_cuts( ) which will be described in detail with regard to FIG. 27.

In step 2510, a logical variable T is defined. The latter is defined by:

T=cuts all resolved & no embedding effect

A test is performed in step 2512 on the value of the logical variable T. If the latter is true, that is to say if all the cuts can be resolved and there is no embedding effect, the vertex considered at 2502 is recorded in the list of faulty zones in step 2514. In step 2516 the following operation is performed:

vertex→vertex_zone_def=1.

On completion of step 2516, or if the variable T is false on completion of step 2510, a decision regarding the analysis is taken in step 2518 according to the method of determination set forth earlier. Next, this decision is returned from step 2520 as response to the function analyse_under_ this_vertex( ).

To establish the list of cuts in step 244 of FIG. 2 corresponding to step 2506 of FIG. 25, the tree to be analysed is traversed with the prefixed-order procedure. As soon as a vertex of a faulty zone is found, an embedding effect indicator is set to 1. Likewise, as soon as an untestable node is encountered, a testability indicator is set to zero. As soon as a bad or untestable cut is encountered, it is added to the list as an element and the cuts counter is incremented. The programming is recursive. The new vertex is the node associated with the current parent and the number_of_cuts, testability and embedding parameters are passed by reference during the recurrences.

At the first call, the number_of_cuts must be initialized to zero, testability must be initialized to one and embedding must be initialized to zero. At the first call, vertex is neither excluded, nor cut, nor vertex of a faulty zone, but testable and tested bad.

Figure 26:
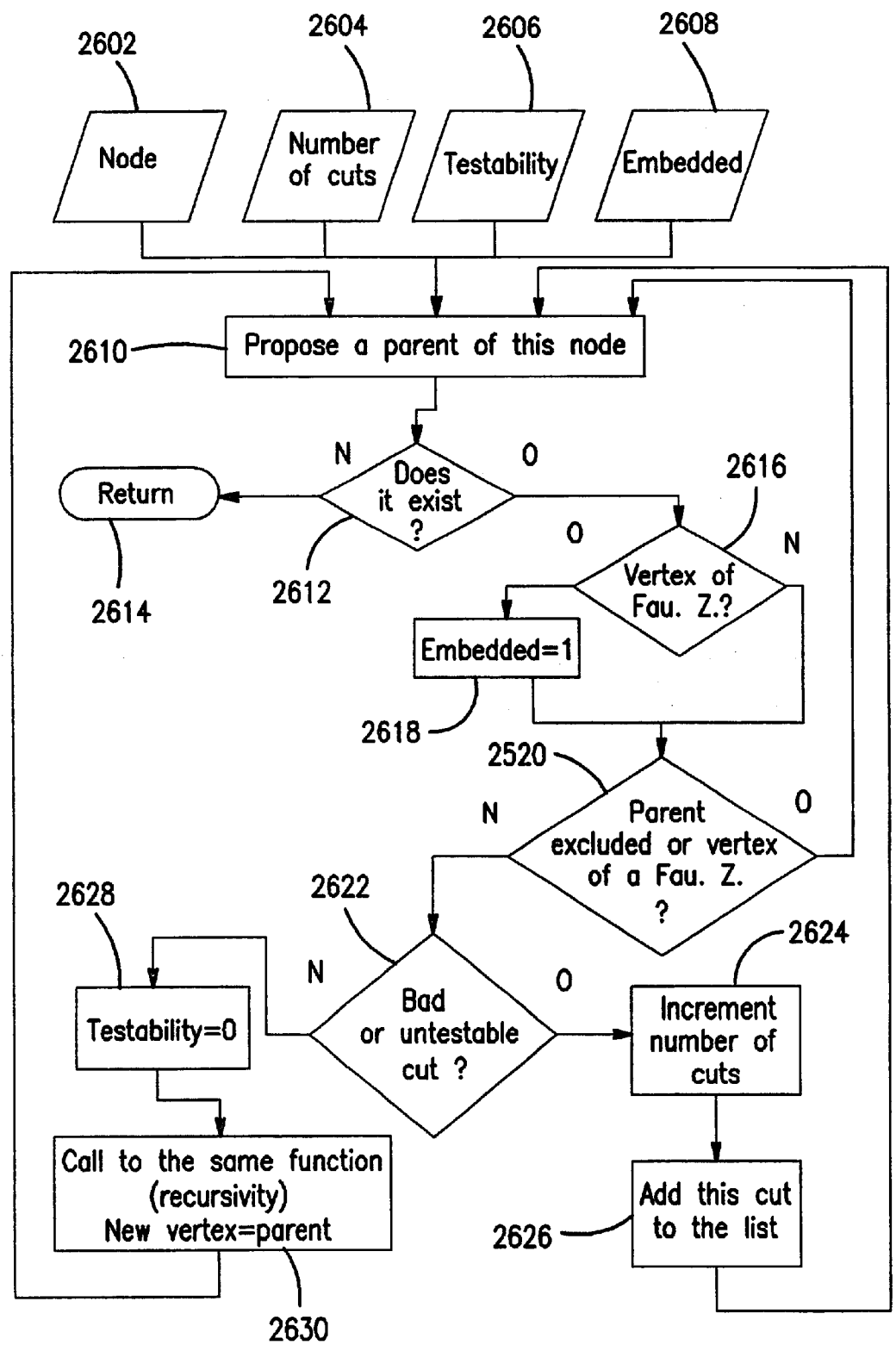
FIG. 26 is a flow chart explaining the construction of the list of cuts through the function list_cuts_for_resolving( )

The detailed algorithm for constructing the list of cuts constituting the function list_cuts_to_be_resolved( ) is described in the flow chart of FIG. 26.

The function list_cuts_to_be_resolved( ) receives as input the vertext 2602 of the tree considered, the number of cuts 2604, a testability variable 2606 and an embedding effect variable 2608.

During the first step 2610, a parent of the node considered is proposed. If during the test performed in step 2612 it is noted that this parent does not exist, then the function is halted at step 2614. If this parent exists, a test is performed in test 2616 to determine whether the parent of this node is or is not a vertex of a faulty zone. If such is the case, the embedding variable is set to 1 in step 2618. Otherwise, the embedding variable is held at its initial value.

The subsequent step 2620 verifies whether we are dealing with an excluded parent or with the vertex of a faulty zone. If the response is positive, step 2610 is implemented so as to propose another parent of the node considered. If the response is negative, step 2622 verifies whether we are dealing with a bad or untestable cut. If such is the case, the number of cuts is incremented in step 2624 then this cut is added to the list of cuts in step 2626. Step 2610 is finally implemented to propose a new parent of the node considered.

On the other hand, if in step 2622 it is noted that we are not dealing with either a bad cut or an untestable node, the testability variable is set to 0 in step 2628. A new call to the function list_cuts_to_be_resolved( ) is performed by recursivity in step 2630 by considering as vertex the parent determined previously in step 2610.

On completion of this recursive call of the function, step 2610 is implemented again so as to propose a new parent to the node considered.

The process described here is performed until depletion of the parents of the node considered.

For the resolution of the cuts in step 246 of FIG. 2, corresponding to step 2508 of FIG. 25, each cut from the list of cuts to be resolved is taken and a search is conducted as to whether it can be resolved in the subtree in which the analysis is being performed.

To decide whether resolution is possible, the previously stated resolution criterion is applied.

Initially, we try to resolve the cut on the vertex. If this attempt fails, we seek a resolution in the remainder of the tree with a recursive procedure. This recursive procedure is described below.

Figure 27:
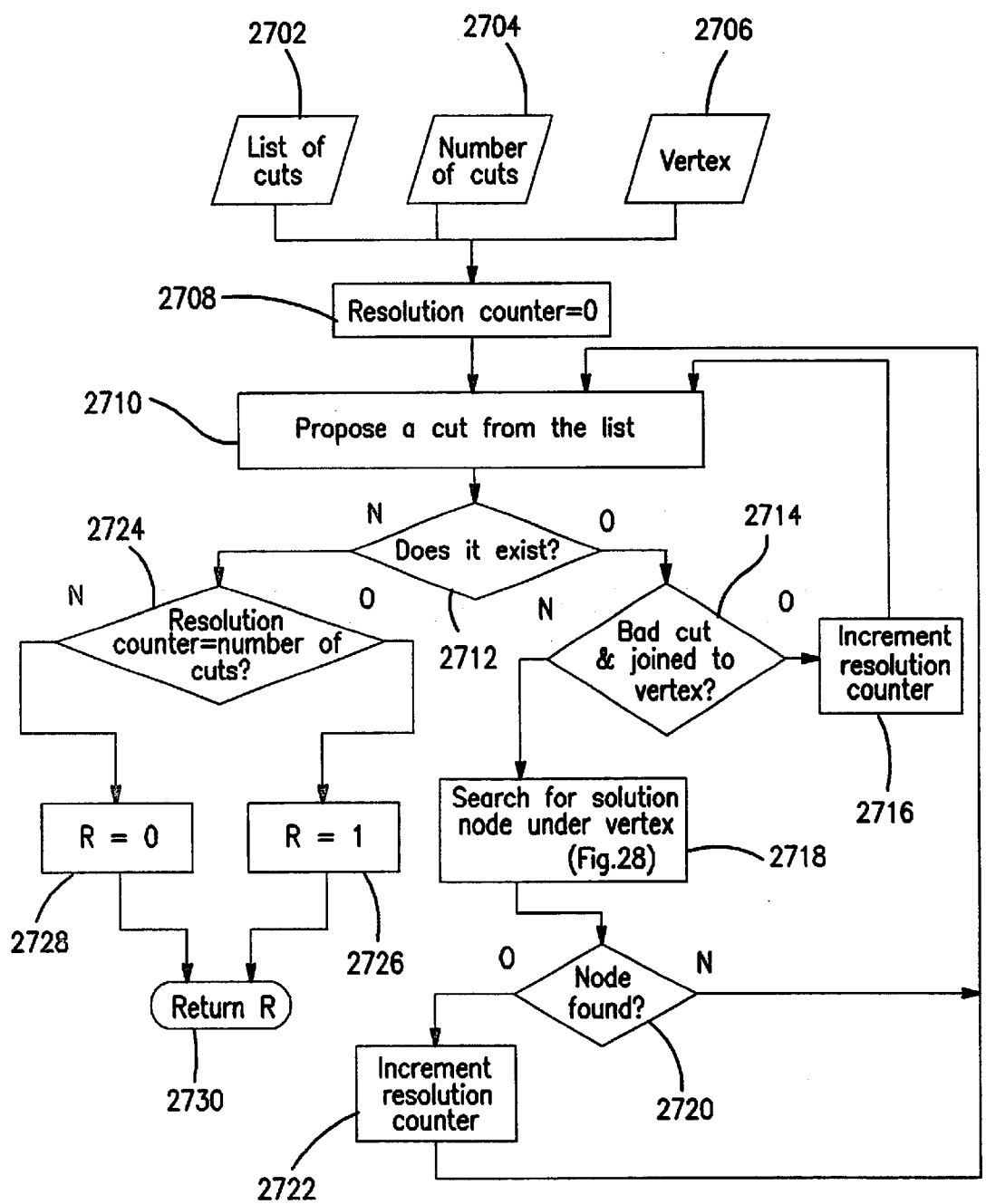
FIG. 27 is a flow chart explaining the algorithm for resolving the cuts through the function resolve_cuts( )

The general procedure for resolving the cuts is detailed in the flow chart of FIG. 27 describing the algorithm of the function resolve_cuts( ).

The function resolve_cuts( ) receives as input the list of cuts 2702, the number of cuts 2704, and also the vertex of the tree considered 2706. Initially, in step 2708 the resolution counter variable is set to 0.

In step 2710, a cut is proposed in the list. Step 2712 verifies that this cut exists. If such is the case, step 2714 determines whether this cut is bad and if the latter is joined to a vertex. If such is the case, the resolution counter is incremented in step 2716 and step 2710 is implemented again so as to propose a new cut.

On the other hand, if the cut proposed is not a bad cut which is joined to a vertex, step 2718 is implemented. The latter consists is searching for a solution node under the vertex considered. This search is performed by calling the function search_a_node( ) which will be described with regard to FIG. 28.

The next step 2720 verifies whether it has been possible to find such a node. If such is the case, the resolution counter is incremented in step 2722. On completion of step 2722, or in the case where no node has been found during the search 2718, a new cut is proposed in the list in step 2710.

If the test undertaken in step 2712 reveals that there are no more cuts in the list, the resolution counter is compared with the number of cuts in step 2724. If these are equal, the variable R is fixed at 1 at step 2726. Otherwise, the latter is fixed at the value 0 in step 2728. The variable R indicates whether or not the resolution has been performed. Finally, the variable R is returned as solution of the function resolve_cut( ) in step 2730.

Figure 28:
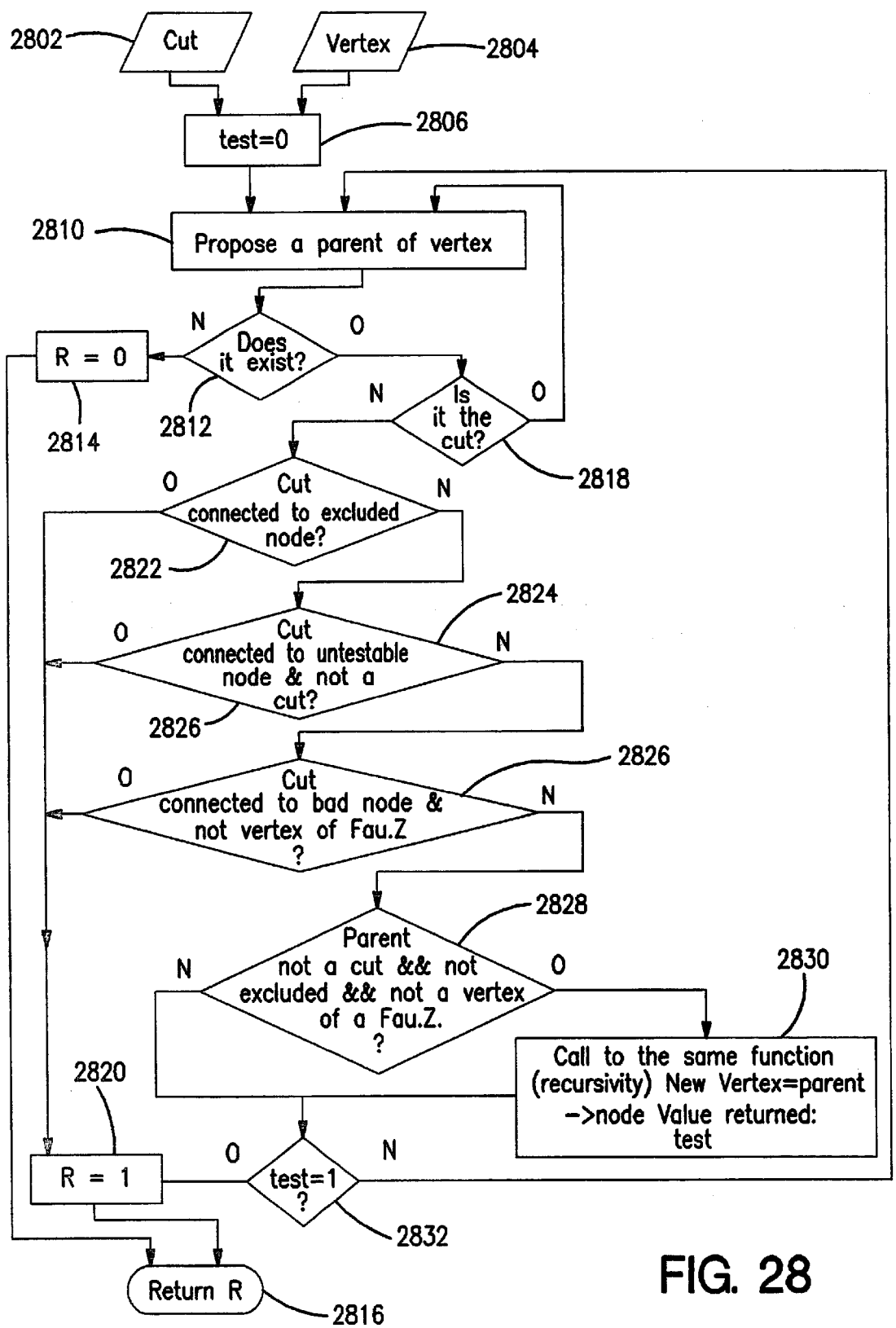
FIG. 28 is a flow chart explaining the search for an internal resolution through the function search_a_node( ).

The search for a solution node performed in step 2718 and constituting the function search_a_node( ) is described in FIG. 28.

The function search_a_node( ) receives as input the cut considered 2808 as well as the vertex of the tree considered 2804.

Initially, the value of the test variable R is fixed at 0 in step 2806. A parent of the vertex considered is proposed in step 2810. Step 2812 verifies whether this parent exists. If such is not the case, the value of the variable R is fixed at 0 in step 2814 and the variable R is returned in step 2816 as result of the function search_a_node( ).

If the parent exists in step 2812, step 2818 determines whether this parent is a cut. If such is the case, a new parent is proposed in step 2810.

If such is not the case, several tests are performed in succession. When one of these tests is verified, the variable R is fixed at the value 1 in step 2820. The first test undertaken in step 2822 consists in verifying whether the node considered is a cut connected to an excluded node. If the response is negative, then step 2824 determines whether this node is a cut connected to an untestable node and is not a cut. If the response is negative, step 2826 determines whether this node is a cut connected to a bad node and not constituting the vertex of a faulty zone. If the response is still negative, step 2828 determines whether, for the node considered, the parents are not a cut, whether it is not excluded and whether it is not the vertex of a faulty zone. If such is the case, a new recursive call of the function search_a_node( ) is performed in step 2830. During this recursive call, the new vertex considered is the parent pointing towards the node.

If on completion of step 2828 or 2830 the value of the test variable R is equal to 1, during a verification step denoted 2832, step 2820 is implemented again. If the value of the test variable is not equal to 1, a new parent of the vertex is proposed in step 2810.

What is claimed is:

1. Process for locating a defective element in an integrated circuit whose theoretical layout is known, of the type comprising a succession of steps consisting in:

the determination of a measurement point of the integrated circuit; and the testing of the measurement point determined by implementing:

the application of a sequence of tests to the inputs of the integrated circuit;

the measurement of signals at the determined measurement point of the integrated circuit, during the application of the sequence of tests; and the assessment of the measurement point by comparison of the measured signals with theoretical signals which ought to be obtained at the determined measurement point so as to assess whether the measurement point is faulty or satisfactory; and in which the position of the defective element of the integrated circuit is determined from assessments performed at the various determined measurement points, characterized in that it comprises initially:

a step of modelling the theoretical layout of the integrated circuit, in the form of at least one graph comprising a set of nodes and of arcs oriented from the inputs of the circuit to the outputs of the circuit;

considering as a search subgraph, a subgraph whose vertex-forming node corresponds to a faulty measurement point;

and in that, for the search for the defective element, it comprises the steps of:

assigning each node of the search subgraph considered a characteristic variable dependent on the structure of the search subgraph;

considering as measurement point the measurement point corresponding to a node of the subgraph considered, obtained by applying a predetermined criterion pertaining to the characteristic variables of the set of nodes of the search subgraph considered;

performing a test of the measurement point considered;

considering as new search subgraph:

either the search subgraph previously considered, while excluding the node corresponding to the measurement point tested and all its parent nodes, if the measurement point is satisfactory or a subgraph whose node corresponding to the measurement point is the vertex, if the measurement point is faulty; and searching for the defective element in the new search subgraph considered, until a predetermined stopping criterion is satisfied.

2. Locating process according to claim 1, characterized in that, during the initial step of modelling the theoretical layout of the integrated circuit, the circuit is modelled in the form of a tree by possible creation of virtual nodes (810;

2208, 2210, 2218) when one and the same node is the parent of at least two nodes, themselves parents of one and the same node.

3. Locating process according to claim 2, characterized in that it comprises, after satisfaction of the predetermined stopping criterion, the steps of:

evaluating in the or each last search subgraph whether, for each virtual node corresponding to a faulty measurement point, the twin node associated with the said virtual node is a node of the same subgraph also corresponding to a faulty measurement point; and then considering the or each subgroup for which the condition is satisfied as corresponding to a part of the integrated circuit comprising at least one defective element.

4. Locating process according to claim 2, characterized in that the said characteristic variable peculiar to each node is the number of ancestors of this node in the search subgraph considered.

5. Locating process according to claim 4, characterized in that the said predetermined criterion is suitable for determining the node whose number of ancestors is substantially equal to the mean number of ancestors per node in the search subtree considered.

6. Locating process according to claim 1, characterized in that it comprises a step of assigning each node a compliance indicator initially fixed at a faulty state; and in that, for the determination of the new search subgraph to be considered, it comprises the steps of:

fixing the compliance indicator of the node corresponding to the measurement point tested and of all its parent nodes at a satisfactory state, if the measurement point tested is satisfactory; and considering as new search subgraph the subgraph included within the previous search subgraph and comprising only those nodes whose compliance indicator is fixed at the faulty state.

7. Locating process according to claim 1, characterized in that the search subgraph initially considered is formed at the intersection of the subgraphs each having as vertex a node corresponding to a faulty output of the integrated circuit.

8. Locating process according to claim 1, characterized in that the said characteristic variable peculiar to each node is the number of ancestors of this node in the search subgraph considered.

9. Device for locating a defective element in an integrated circuit whose theoretical layout is known, of the type comprising means for performing a succession of steps consisting in:

the determination of a measurement point of the integrated circuit; and the testing of the measurement point determined by implementing:

the application of a sequence of tests to the inputs of the integrated circuit;

the measurement of signals at the determined measurement point of the integrated circuit, during the application of the sequence of tests; and the assessment of the measurement point by comparison of the measured signals with theoretical signals which ought to be obtained at the determined measurement point so as to assess whether the measurement point is faulty or satisfactory; and means for determining the position of the defective element of the integrated circuit from assessments performed at the various determined measurement points, characterized in that it comprises:

means for initial modelling of the theoretical layout of the integrated circuit, in the form of at least one graph comprising a set of nodes and of arcs oriented from the inputs of the circuit to the outputs of the circuit;

means for initially considering as a search subgraph a subgraph whose vertex-forming node corresponds to a faulty measurement point;

and in that, for searching for the defective element, it comprises means for:

assigning each node of the search subgraph considered a characteristic variable dependent on the structure of the search subgraph;

considering as measurement point the measurement point corresponding to a node of the subgraph considered, obtained by applying a predetermined criterion pertaining to the characteristic variables of the set of nodes of the search subgraph considered;

performing a test of the measurement point considered;

considering as new search subgraph:

either the search subgraph previously considered, while excluding the node corresponding to the measurement point tested and all its parent nodes, if the measurement point is satisfactory or a subgraph whose node corresponding to the measurement point is the vertex, if the measurement point is faulty; and searching for the defective element in the new search subgraph considered, until a predetermined stopping criterion is satisfied.

* * * * *